(12) United States Patent
Manico et al.

(10) Patent No.: US 6,963,594 B2
(45) Date of Patent: Nov. 8, 2005

(54) ORGANIC LASER CAVITY DEVICE HAVING INCOHERENT LIGHT AS A PUMPING SOURCE

(75) Inventors: Joseph A. Manico, Rochester, NY (US); John P. Spoonhower, Webster, NY (US); David L. Patton, Webster, NY (US); Edward Covannon, Ontario, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 10/271,816

(22) Filed: Oct. 16, 2002

(65) Prior Publication Data

US 2004/0076200 A1 Apr. 22, 2004

(51) Int. Cl.$^7$ .............................. H01S 3/14; H01S 3/20; H01S 3/09; H01S 3/095

(52) U.S. Cl. .............................. 372/39; 372/53; 372/69; 372/89; 372/91

(58) Field of Search .............................. 372/39, 53, 69, 372/89, 91, 45, 50, 70, 92, 99, 29.022, 7

(56) References Cited

U.S. PATENT DOCUMENTS

| | | | | |
|---|---|---|---|---|
| 3,800,132 A | * | 3/1974 | Postal | 362/34 |
| 5,553,092 A | * | 9/1996 | Bruce et al. | 372/72 |
| 5,561,679 A | | 10/1996 | Mannik et al. | 372/43 |
| 5,881,083 A | | 3/1999 | Diaz-Garcia et al. | |
| 5,881,089 A | | 3/1999 | Berggren et al. | |
| 6,160,828 A | * | 12/2000 | Kozlov et al. | 372/39 |
| 6,194,119 B1 | | 2/2001 | Wolk et al. | |
| 6,687,274 B2 | * | 2/2004 | Kahen | 372/39 |

FOREIGN PATENT DOCUMENTS

| | | |
|---|---|---|
| WO | WO 98/50989 | 11/1998 |
| WO | WO01013481 | * 2/2001 |

OTHER PUBLICATIONS

"Vertical–Cavity Surface–Emitting Lasers" by Carl W. Wilmsen, Henryk Temkin, and Larry A. Coldren. Cambridge University Press, Cambridge, United Kingdom, pp. 268–276.

U.S. Appl. No. 09/832,759, filed Apr. 11, 2001, Keith B. Kahen et al.

U.S. Appl. No. 10/066,829, filed Feb. 4, 2002, Keith B. Kahen.

U.S. Appl. No. 10/066,936, filed Feb. 4, 2002, Keith B. Kahen et al.

Susumu Kinoshita et al., "Circular Buried Heterostructure (CBH) GaAlAs/GaAs Surface Emitting Lasers," IEEE Journal of quantum Electronics, vol. QE–23, No. 6, Jun. 1987, pp. 882–888.

(Continued)

Primary Examiner—Minsun Oh Harvey
Assistant Examiner—Armando Rodriguez
(74) Attorney, Agent, or Firm—Stephen H. Shaw

(57) ABSTRACT

An organic laser cavity device, that includes: a first dielectric stack for receiving and transmitting pumped beam light and being reflective to laser light over a predetermined range of wavelengths and having a substantially low threshold for optical excitation; an organic active region for receiving the transmitted pumped beam light and laser light from the first dielectric stack, and emits the laser light; a second dielectric stack for reflecting the transmitted pumped beam light and the laser light from the organic active region back into the organic active region, wherein a combination of the first and second dielectric stacks and the organic active region outputs the laser light; and an external self-contained photon source of the pumped beam light cooperating with the organic laser cavity for optical excitation at the substantially low threshold.

29 Claims, 18 Drawing Sheets

OTHER PUBLICATIONS

Kent D. Choquette et al., "Vertical–Cavity Surface Emitting Lasers: Moving from Research to Manufacturing," Proceedings of the IEEE, vol. 85, No. 11, Nov. 1997, pp. 1730–1739.

T. Ishigure, et al., "2.5 Gbit/s 100m data transmission using graded–index polymer optical fibre and high–speed laser diode at 650nm wavelength," Electronics Letters, Mar. 16, 1995, vol. 31, No. 6, pp. 467–469.

G. Kranzelbinder et al., "Oragnic solid–state lasers," Rep. Prog. Phys. 63 (2000) pp. 729–762.

V. G. Kozlov et al., "Study of lasing action based on Forster energy transfer in optically pumped oragnic semiconductor thin films," Journal of Applied Physics, vol. 84, No. 8, Oct. 15, 1998, pp. 4096–4108.

N. Tessler et al., "Pulsed excitation of low–mobility light--emitting diodes: Implication for organic lasers," Applied Physics Letters, vol. 74, No. 19, May 10, 1999, pp. 2764–2766.

Nir Tessler et al., "High Peak Brightness Polymer Light-Emitting Diodes," Advanced Materials, 1998, 10, No. 1, pp. 64–68.

J. H. Schon et al., "an Organic Solid State Injection Laser," SCIENCE, vol. 289, Jul. 28, 2000, pp. 599–601.

M. D. McGehee et al., "Semiconducting polymer distributed feedback lasers," 1998 American Institute of Physics, Applied Physics Letters, vol. 72, No. 13, Mar. 30, 1998, pp. 1536–1538.

M. Berggren et al., "Light amplification in organic thin films using cascade energy transfer," Letters to Nature, vol. 389, Oct. 2, 1997, pp. 466–469.

Scott W. Corzine et al., "Design of Fabry–Perot Surface–Emitting Lasers with a Periodic Gain Structure," IEEE Journal of Quantum Electronics, vol. 25, No. 6, Jun. 1989, pp. 1513–1524.

"Transform–Limited, Narrow–Linewidth Lasing Action in Organic Semiconductor Microcavities" by V. Bulovic, V.G. Kozlov, V.B. Khalfin, S.R. Forrest. *Science*, vol. 279, Jan. 23, 1998.

* cited by examiner

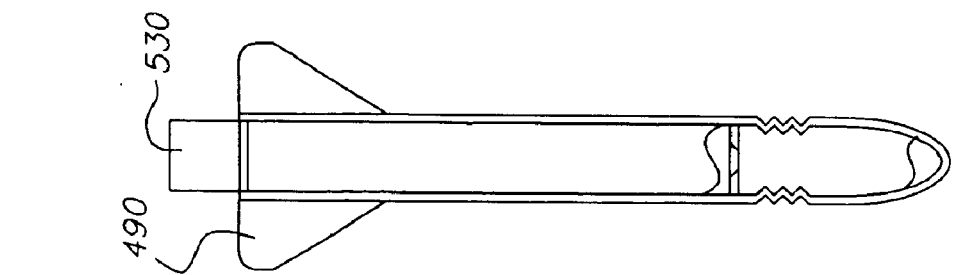
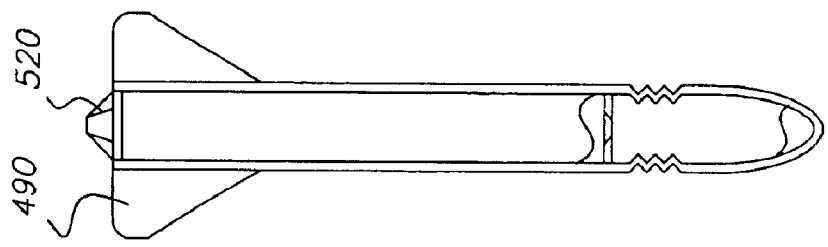
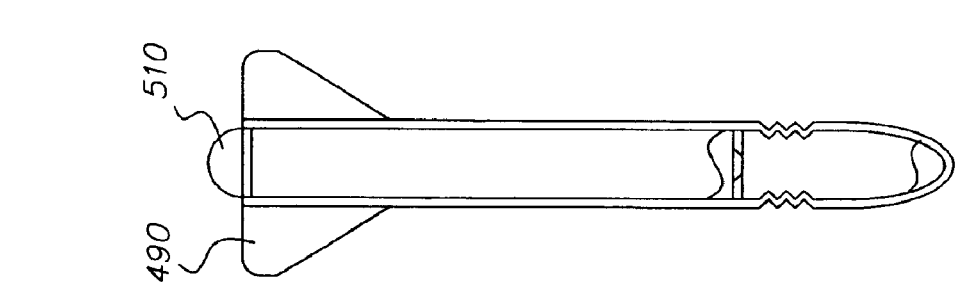
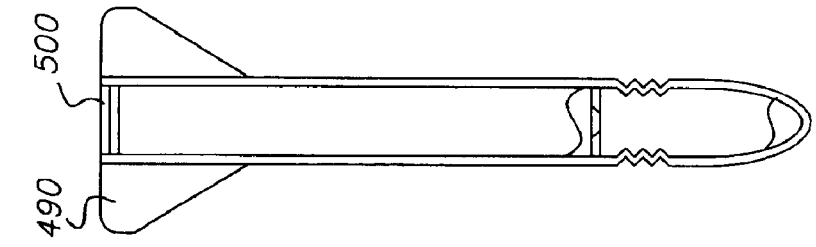
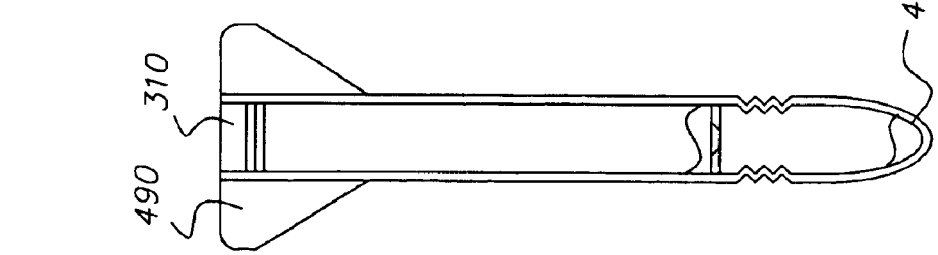
FIG. 13a  FIG. 13b  FIG. 13c  FIG. 13d  FIG. 13e  FIG. 13f

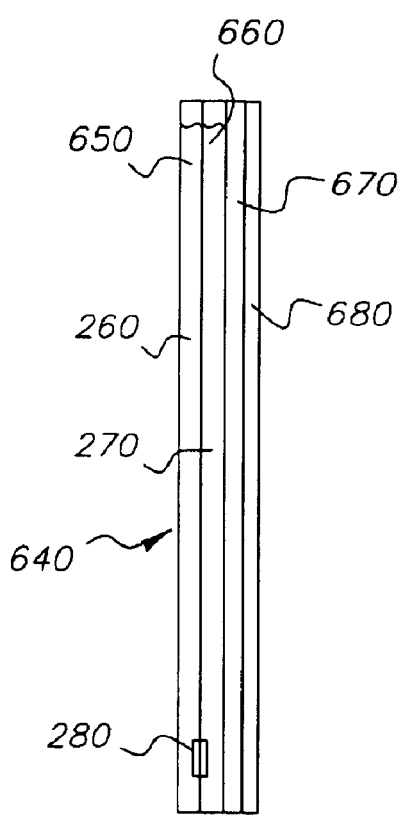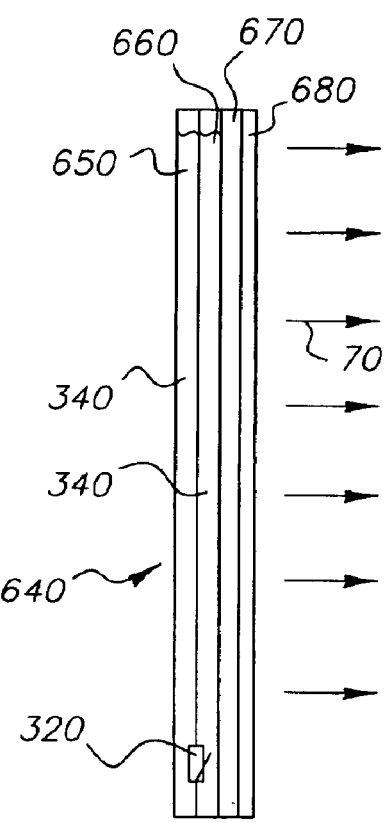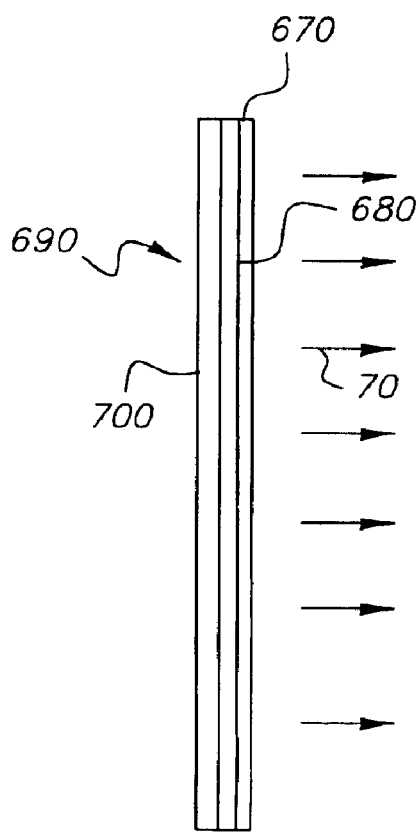
FIG. 20a
FIG. 20b
FIG. 22

ORGANIC LASER CAVITY DEVICE HAVING INCOHERENT LIGHT AS A PUMPING SOURCE

CROSS-REFERENCE TO RELATED APPLICATIONS

Reference is made to commonly assigned U.S. patent application Device Apparatus for Driving Vertical Laser Cavity" by Keith B. Kahen et al.; commonly assigned U.S. patent application Ser. No. 10/066,936 filed Feb. 4, 2002 titled "Organic Vertical Cavity Lasing Devices Containing Periodic Gain Regions" by Keith B. Kahen et al.; and commonly assigned U.S. patent application Ser. No. 10/066, 829 filed Feb. 4, 2002 titled "Organic Vertical Cavity Phase-Locked Laser Array Device" by Keith B. Kahen, the disclosures of which are incorporated herein by reference.

FIELD OF THE INVENTION

The invention relates generally to the field of vertical cavity organic lasers, and in particular to using non-conventional pump beam photon sources to produce laser emissions. More specifically, the invention relates to using self-contained photon sources wherein the energy source for producing photons are chemical, radiological, and biological reactions.

BACKGROUND OF THE INVENTION

Laser light producing devices have a myriad of applications including communications, guidance systems, surveying, emergency rescue, and military applications. Current laser systems require complex, expensive, and fragile electronic circuits, components, and batteries, or other electronic power sources. Metals are required in the construction of these systems and are susceptible to detection due to this metallic content. These systems also produce residual electrical emissions that could interfere with other electronic/electrical systems.

Vertical cavity surface emitting lasers (VCSELs) based on inorganic semiconductors (e.g. AlGaAs) have been developed since the mid-80's (Susumu Kinoshita et al., IEEE Journal of Quantum Electronics, Vol. QE-23, No. 6, June 1987, pages 882–888). They have reached the point where AlGaAs-based VCSELs emitting at 850 nm are manufactured by a number of companies and have lifetimes beyond 100 years (Kent D. Choquette et al., Proceedings of the IEEE 85, Vol. 85, No. 11, November 1997, pages 1730–1739). With the success of these near-infrared lasers, attention in recent years has turned to other inorganic material systems to produce VCSELs emitting in the visible wavelength range (C. Wilmsen et al., *Vertical-Cavity Surface-Emitting Lasers,* Cambridge University Press, Cambridge, 2001, pp. 268–276). There are many potential applications for visible lasers, such as, display, optical storage reading/writing, laser printing, and short-haul telecommunications employing plastic optical fibers (T. Ishigure et al., Electronics Letters, Vol. 31, No. 6, Mar. 16, 1995, pages 467–469). In spite of the worldwide efforts of many industrial and academic laboratories, much work remains to be done to create viable laser diodes (either edge emitters or VCSELs) that produce light output that spans the visible spectrum.

In an effort to produce visible wavelength VCSELs it would be advantageous to abandon inorganic-based systems and focus on organic-based laser systems, since organic-based gain materials can enjoy a number of advantages over inorganic-based gain materials in the visible spectrum. For example, typical organic-based gain materials have the properties of low unpumped scattering/absorption losses and high quantum efficiencies. In comparison to inorganic laser systems, organic lasers are relatively inexpensive to manufacture, can be made to emit over the entire visible range, can be scaled to arbitrary size and, most importantly, are able to emit multiple wavelengths (such as red, green, and blue) from a single chip. Finally, organic lasers have a very large gain bandwidth, especially in comparison with inorganic lasers. Over the past number of years, there has been increasing interest in making organic-based solid-state lasers. The laser gain material has been either polymeric or small molecule and a number of different resonant cavity structures were employed, such as, microcavity (see Kozlov et al., U.S. Pat. No. 6,160,828 issued Dec. 12, 2000, titled "Organic Vertical-Cavity Surface-Emitting Laser"), waveguide, ring microlasers, and distributed feedback (see also, for instance, G. Kranzelbinder et al., Rep. Prog. Phys. 63, (2000) pages 729–762 and M. Diaz-Garcia et al., U.S. Pat. No. 5,881,083 issued Mar. 9, 1999, titled "Conjugated Polymers As Materials For Solid State Laser"). A problem with all of these structures is that in order to achieve lasing it was necessary to excite the cavities by optical pumping using another laser source. It is much preferred to electrically pump the laser cavities since this generally results in more compact and easier to modulate structures.

A main barrier to achieving electrically pumped organic lasers is the small carrier mobility of organic material, which is typically on the order of $10^{-5}$ cm$^2$/(V–s). This low carrier mobility results in a number of problems. Devices with low carrier mobilities are typically restricted to using thin layers in order to avoid large voltage drops and ohmic heating. These thin layers result in the lasing mode penetrating into the lossy cathode and anode, which causes a large increase in the lasing threshold (see V.G. Kozlov et al., Journal of Appl. Physics, Vol. 84, No. 8, Oct. 15, 1998, pages 4096–4108). Since electron-hole recombination in organic materials is governed by Langevin recombination (whose rate scales as the carrier mobility), low carrier mobilities result in orders of magnitude having more charge carriers than singlet excitons; one of the consequences of this is that charge-induced (polaron) absorption can become a significant loss mechanism (N. Tessler et al., Applied Physics Letters, Vol. 74, No. 19, May 10, 1999, pages 2764–2766). Assuming laser devices have a 5% internal quantum efficiency, using the lowest reported lasing threshold to date of ~100 W/cm$^2$ (M. Berggren et al., Nature, Vol. 389, Oct. 2, 1997, pages 466–469), and ignoring the above mentioned loss mechanisms, would put a lower limit on the electrically-pumped lasing threshold of 1000 A/cm$^2$. Including these loss mechanisms would place the lasing threshold well above 1000 A/cm$^2$, which to date is the highest reported current density, which can be supported by organic devices (Nir Tessler, Advanced Materials, 1998, 10, No. 1, pages 64–68).

One way to avoid these difficulties is to use crystalline organic material instead of amorphous organic material as the lasing media. This approach was recently taken (J. H. Schon, Science, Vol. 289, Jul. 28, 2000, pages 599–601) where a Fabry-Perot resonator was constructed using single crystal tetracene as the gain material. By using crystalline tetracene, larger current densities can be obtained, thicker layers can be employed (since the carrier mobilities are on the order of 2 cm$^2$/(V–s)), and polaron absorption is much lower. Using crystal tetracene as the gain material resulted in room temperature laser threshold current densities of approximately 1500 A/cm$^2$.

An alternative to electrical pumping for organic lasers is optical pumping by incoherent light sources, such as, light emitting diodes (LEDs), either inorganic (M. D. McGehee et al., Applied Physics Letters, Vol. 72, No. 13, Mar. 30, 1998, pages 1536–1538) or organic (Berggren et al., U.S. Pat. No. 5,881,089 issued Mar. 9, 1999, titled "Article Comprising An Organic Laser"). This possibility is the result of unpumped organic laser systems having greatly reduced combined scattering and absorption losses (~0.5 cm$^{-1}$) at the lasing wavelength, especially when one employs a host-dopant combination as the active media. Even taking advantage of these small losses, the smallest reported optically pumped threshold for organic lasers to date is 100 W/cm$^2$ based on a waveguide laser design (M. Berggren et al., Nature 389, Oct. 2, 1997, pages 466–469). Since off-the-shelf inorganic LEDs can only provide up to ~20 W/cm$^2$ of power density, it is necessary to take a different route to enable optically pumping by incoherent sources. Additionally, in order to lower the lasing threshold it is necessary to choose a laser structure that minimizes the gain volume.

Undesirable electrical noise can be emitted from LEDs and require an external power supply, along with electronic components/circuitry to operate. These circuits are usually metallic and can be detected in covert situations. Damage to these LEDs and supporting circuitry can occur from external electromagnetic emissions.

What is needed is a reliable, robust, laser light producing device capable of producing a laser emission in extreme environments without the previously mentioned limitations of conventional electrical sources and supporting circuitry that power the laser light producing device.

SUMMARY OF THE INVENTION

The need is met according to one embodiment of the present invention by providing an organic laser cavity device, that includes: a first dielectric stack for receiving and transmitting pumped beam light and being reflective to laser light over a predetermined range of wavelengths and having a substantially low threshold for optical excitation; an organic active region for receiving the transmitted pumped beam light and the laser light from the first dielectric stack, and emitting the laser light; a second dielectric stack for reflecting the transmitted pumped beam light and the laser light from the organic active region back into the organic active region, wherein a combination of the first and the second dielectric stacks and the organic active region outputs the laser light; and an external self-contained photon source of the pumped beam light cooperating with the organic laser cavity device for optical excitation at the substantially low threshold.

ADVANTAGEOUS EFFECT OF THE INVENTION

The advantages of the invention are the capability of producing a laser emission without residual electromagnetic emissions, high metal content components, batteries and other electronic power sources, and electronic circuits and components. Other advantages include long duration laser emissions, long inactive storage capacity, robust physical configurations, few required components, variable physical configurations, and variable laser emission configurations. In addition, the ability, according to the present invention, to modulate a laser emission with an audio signal such as a human voice.

BRIEF DESCRIPTION OF THE DRAWINGS

The above and other objects, features, and advantages of the present invention will become more apparent when taken in conjunction with the following description and drawings wherein identical reference numerals have been used, where possible, to designate identical features that are common to the figures, and wherein:

FIG. 13a is a schematic cross-section view of a chemically powered laser flare in an inactivated state with a shrouded laser array made in accordance with the present invention;

FIG. 13b is a schematic cross-section view of a dart-configured chemically powered laser flare in an inactivated state with a shrouded laser array made in accordance with the present invention;

FIG. 13c is a schematic cross-section view of a dart-configured chemically powered laser flare in an inactivated state with an exposed laser array made in accordance with the present invention;

FIG. 13d is a schematic cross-section view of a dart-configured chemically powered laser flare in an inactivated state with a hemispheric laser array made in accordance with the present invention;

FIG. 13e is a schematic cross-section view of a dart-configured chemically powered laser flare in an inactivated state with a polyhedron laser array made in accordance with the present invention;

FIG. 13f is a schematic cross-section view of a dart-configured chemically powered laser flare in an inactivated state with a cylindrical laser array made in accordance with the present invention;

FIG. 20a is schematic cross-sectional side view of a chemically illuminated flexible sheet laser emitter in an inactivated state in accordance with the present invention;

FIG. 20b is schematic cross-sectional side view of a chemically illuminated flexible sheet laser emitter in an inactivated state in accordance with the present invention;

FIG. 22 is schematic cross-sectional side view of a radio illuminated flexible sheet laser emitter in an inactivated state in accordance with the present invention;

To facilitate understanding, identical reference numerals have been used, where possible, to designate identical elements that are common to the figures.

DETAILED DESCRIPTION OF THE INVENTION

Figure 1:
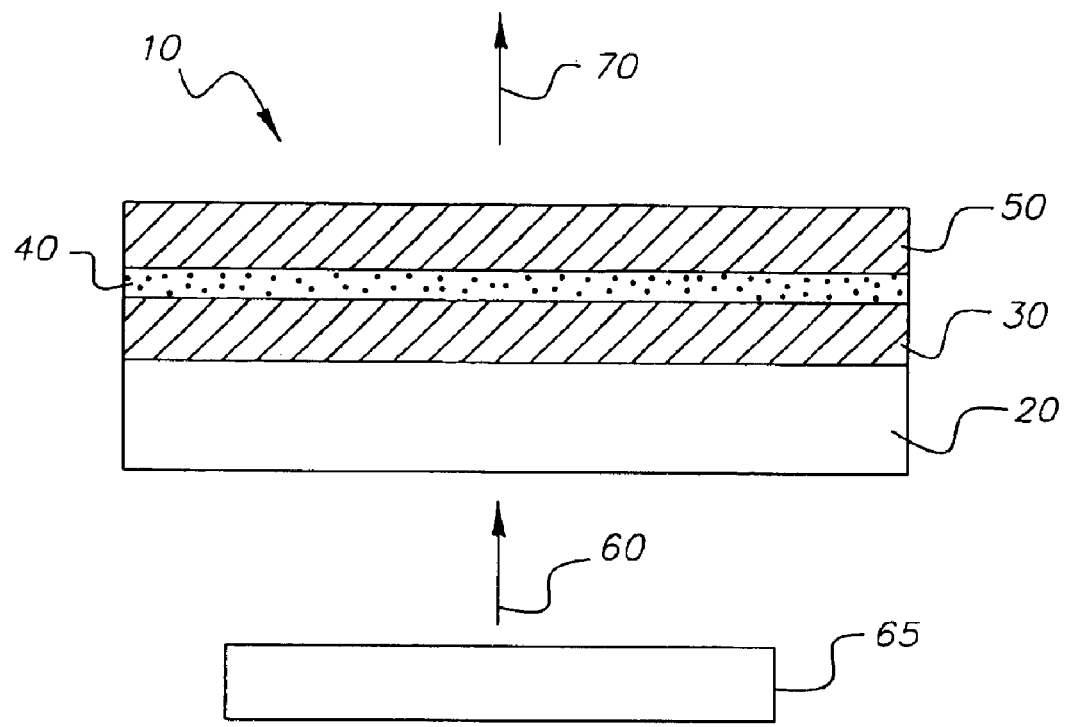
FIG. 1 is a schematic cross-section view of a vertical cavity organic laser device made in accordance with the present invention.

A VCSEL-based microcavity laser satisfies the criterion of low lasing threshold. Using VCSEL-based organic laser cavities should enable optically pumped power density thresholds below 5 W/cm$^2$. As a result, practical organic laser devices can be driven by optically pumping with a variety of readily available, incoherent light sources, such as self-contained photon sources. Herein, self-contained photon sources are photon sources wherein the energy source for emission of light are chemical, radiological, and biological reactions directly producing photons. These self-contained photon sources do not require external electrical connections for their operation.

Several types of self-contained photon producing processes that do not have electrical noise characteristics can include; incandescence, luminescence, bioluminescence, thermoluminescence, fluorescence, phosphorescence, and radioluminescence photon processes.

Radioluminescence (RL) is the generation of photons by a light-producing medium after the absorption of energy from the decay of radioactive particles. Since RL is powered by the decay of radioactive isotopes, external electrical power supplies are unnecessary.

Fluorescence is defined as light emission from an excited singlet state of a molecule or an atom. Fluorescence is the emission of light by a substance which is itself exposed to electromagnetic radiation, especially light. Incident light excites electrons to higher electronic energy levels, and a subsequent return to the ground state causes fluorescence. A common fluorescent substance is fluorescein, a dye that shows an intense green fluorescence. Fluorescent "whitening" agents added to detergents work by converting ultraviolet light incident on them into visible light. Fluorescence differs from phosphorescence in that fluorescence ceases within about a microsecond of the stimulus ceasing, whereas phosphorescence can persist for minutes.

Phorphorescence is defined as light emission from an excited triplet state of a molecule or an atom. Phosphorescence proceeds from excited electronic energy levels such that transitions to the unexcited or ground state of the system are "forbidden." This forbidden character results in much slower light emission rates.

The production of bioluminescence is the result of an oxidation reaction (or, 'burning reaction') involving a chemical compound, luciferin, and a specific enzyme, luciferase, which aids in the oxidation process. Luciferin is a light emitting compound which may be acquired by an organism through internal synthesis or externally through diet. It is a water-soluble compound, produced in the cells of the organism, known as intracellular luminescence, or it also may be generated outside the cell in extracelluar luminescence. Luciferin may be stored under an area of transparent cuticle in the light organ, where a layer of dense tissue may be found behind the luciferin, acting as a reflector.

In order to produce light in the chemical reaction, luciferin must be oxidized with the aid of the natural enzyme, luciferase, an oxygenase (adds oxygen to compounds) which requires a substrate (luciferin) and oxygen (also may require salt) to excite electrons to make them transfer to a higher energy orbital. It is as such electrons fall back into their initial groundstate that light is emitted. The reaction responsible for bioluminescence may be expressed thus: luciferin+luciferase+O2+salt→oxyluciferin+H2O+light+heat.

The reactants of the reaction may be bound collectively as a photoprotein and may be triggered to generate light by a calcium ion (Ca2+)(22). It may also be noted that oxyluciferin reverts into luciferin in order to repeat the process to produce light and that although heat is a by-product of the reaction, there is little heat emitted from the reaction in relation to artificial methods of light production. The firefly, for use of an example, is known to be one of the most efficient lighting systems: though dim, the light of the firefly is approximately 90.0% efficient, with at least 3.0% energy lost to heat. The average lightbulb, however, is only approximately 3.0% efficient, with an energy loss to heat of 97.0%.

Bioluminescent reactions are created by living organisms such as fireflies (Lampyridae); other organisms possessing bioluminescence include, but may not be limited to, varying species of more than forty orders or groups of bacteria, fungi, dinoflagellates, jellyfish, squid, echinoderms (starfish), cordates (worms), molluscs, arthropods (crabs and shrimp), fish (near-surface or deep-sea), beetles, and fireflies. Bacteria have been observed to form symbiotic relations with species of fish and jellyfish, which subsequently become luminous (photophore). However, some organisms are self-luminous by use of photogenic organs containing photocysts and the internal production of required chemicals for luminescence. Bioluminescence is a prevalent property of deep-sea fish and other organisms. It has been discovered that more than 70.0% of species in the deep sea produce light to compensate for the lack of sunlight they cannot receive in the deep water. Insects are the most common land inhabitants with the ability to produce their own light, which may be simple, like a camouflaged flap of skin, or complex, with reflectors, chromatophore filters, and a lens. Found most exclusively in photogenic zoological subjects (but also in two groups of botanical groups), bioluminescence- or chemiluminescence- may be defined as the voluntarily or involuntarily emission of visible light at relatively low temperatures by living organisms which lacks the generation of much heat, the result of the exergonic oxidation process of chemical compound, luciferin, as produced by cells, where energy is converted into light. A second type of light emission is also recognized as either photoluminescence, fluorescence, or phosphorescence: the involuntary emission of light of an organism, dependant upon the prior absorption of light, including ultraviolet wavelengths.

Chemiluminescent reactions are demonstrated by a Cyalume lightstick™, otherwise known as a chemiluminescent flare. This chemiluminescent flare is made of a flexible plastic tube containing a thin-walled glass tube. Inside the glass tube is a solution of hydrogen peroxide, H2O2, dissolved in a phthalic ester. Outside the glass tube is a solution containing a phenyl oxalate ester and a fluorescent dye. (In the yellow-green lightsticks the dye is 9,10-bis (phenylethynyl)anthracene.) When the lightstick is bent, the thin-walled glass tube breaks and its contents mix with the solution outside. Then, the $H_2O_2$ reacts with the phenyl oxalate ester. During the reaction, an intermediate forms that transfers energy to the dye molecules. The energized dye molecules release this energy as visible light. The process in which energy from a chemical reaction is released directly as light is called chemiluminescence.

A schematic of a vertical cavity organic laser device 10 is shown in FIG. 1. The substrate 20 can either be light transmissive or opaque, depending on the intended direction of optical pumping and laser emission. Light transmissive substrates may be transparent glass, plastic, or other transparent materials such as sapphire. Alternatively, opaque substrates including, but not limited to, semiconductor material (e.g. silicon) or ceramic material may be used in the case where both optical pumping and emission occur through the same surface. On the substrate 20 is deposited a bottom dielectric stack 30 followed by an organic active region 40. A top dielectric stack 50 is then deposited. A pump beam 60 optically pumps the vertical cavity organic laser device 10. Pump beam source 65 may emit an incoherent pump beam 60, such as emission from a light-emitting diode (LED). Alternatively, the pump beam 60 may originate from a coherent laser source. FIG. 1 shows laser emission 70 from the top dielectric stack 50. Alternatively, the laser device could be optically pumped through the top dielectric stack 50 with the laser emission through the substrate 20 by proper design of the dielectric stack reflectivities. In the case of an opaque substrate, such as silicon, both optical pumping and laser emission occur through the top dielectric stack 50.

The preferred material for the organic active region 40 is a small-molecular weight organic host-dopant combination, typically, deposited by high-vacuum thermal evaporation. These host-dopant combinations are advantageous since they result in very small unpumped scattering/absorption losses for the gain media. It is preferred that the organic molecules be of small-molecular weight since vacuum-deposited materials can be deposited more uniformly than spin-coated polymeric materials. It is also preferred that the host materials used in the present invention are selected such that they have sufficient absorption of the pump beam 60 and are able to transfer a large percentage of their excitation energy to a dopant material via Förster energy transfer. Those skilled in the art are familiar with the concept of Förster energy transfer, which involves a radiationless transfer of energy between the host and dopant molecules. An example of a useful host-dopant combination for red-emitting lasers is aluminum tris(8-hydroxyquinoline) (Alq) as the host and [4-(dicyanomethylene)-2-t-butyl-6-(1,1,7,7,-tetramethyljulolidyl-9-enyl)-4H-pyran] (DCJTB) as the dopant (at a volume fraction of 1%). Other host-dopant combinations can be used for other wavelength emissions. For example, in the green a useful combination is Alq as the host and [10-(2-benzothiazolyl)-2,3,6,7-tetrahydro-1,1,7,7-tetramethyl-1H, 5H, 11H-[1]Benzopyrano[6,7,8-ij] quinolizin-11-one] (C545T) as the dopant (at a volume fraction of 0.5%). Other organic gain region materials can be polymeric substances, e.g., polyphenylenevinylene derivatives, dialkoxy-polyphenylenevinylenes, poly-para-phenylene derivatives, and polyfluorene derivatives, as taught by Wolk et al. in commonly assigned U.S. Pat. No. 6,194,119 issued Feb. 27, 2001, and titled "Thermal Transfer Element And Process For Forming Organic Electroluminescent Devices," and referenced herein.

The bottom and top dielectric stacks 30 and 50, respectively, are preferably deposited by conventional electron-beam deposition and can comprise alternating high index and low index dielectric materials, such as, $TiO_2$ and $SiO_2$, respectively. Other materials, such as $Ta_2O_5$ for the high index layers, could be used. The bottom dielectric stack 30 is deposited at a temperature of approximately 240° C. During the top dielectric stack 50 deposition process, the temperature is maintained at around 70° C. to avoid melting the organic active materials. In an alternative embodiment of the present invention, the top dielectric stack 50 is replaced by the deposition of a reflective metal mirror layer. Typical metals are silver or aluminum, which have reflectivities in excess of 90%. In this alternative embodiment, both the pump beam 60 and the laser emission 70 would proceed through the substrate 20. Both the bottom dielectric stack 30 and the top dielectric stack 50 are reflective to laser light over a predetermined range of wavelengths, in accordance with the desired emission wavelength of the vertical cavity organic laser device 10.

The use of a vertical microcavity with very high finesse allows a lasing transition at a very low threshold (below 0.1 $W/cm^2$ power density). This low threshold enables incoherent optical sources to be used for the pumping instead of the focused output of laser diodes, which is conventionally used in other laser systems. An example of a pump source is a UV LED, or an array of UV LEDs, e.g. from Cree (specifically, the XBRIGHT® 900 Ultraviolet Power Chip® LEDs). These sources emit light centered near 405 nm wavelength and are known to produce power densities on the order of 20 $W/cm^2$ in chip form. Thus, even taking into account limitations in utilization efficiency due to device packaging and the extended angular emission profile of the LEDs, the LED brightness is sufficient to pump the laser cavity at a level many times above the lasing threshold.

Figure 2:
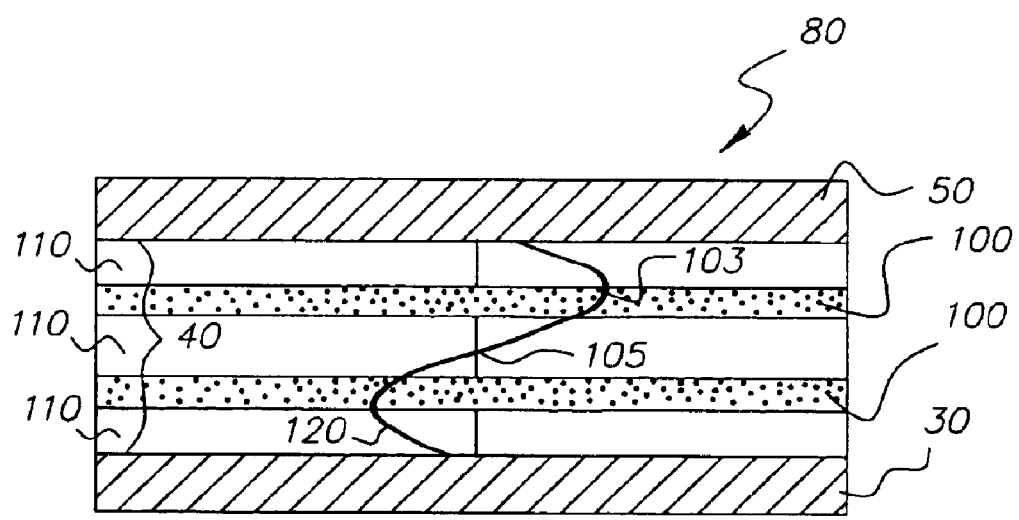
FIG. 2 is a schematic cross-section view of another embodiment of a vertical cavity organic laser device made in accordance with the present invention.
Figure 3:
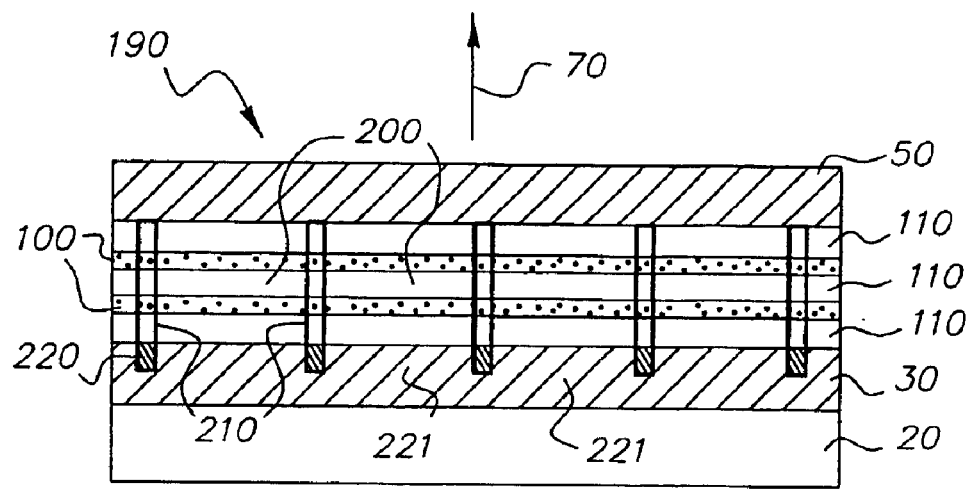
FIG. 3 is a schematic cross-section view of a phase-locked organic laser array.

The efficiency of the laser is improved further using an active region design as depicted in FIG. 2 for the vertical cavity organic laser device 80. The organic active region 40 includes one or more periodic gain regions 100 and organic spacer layers 110 disposed on either side of the periodic gain regions 100 and arranged so that the periodic gain regions 100 are aligned with antinodes 103 of the device's standing wave electromagnetic field 120. This is illustrated in FIG. 2 where the laser's standing electromagnetic field pattern 120 in the organic active region 40 is schematically drawn. Since stimulated emission is highest at the antinodes 103 and negligible at the nodes 105 of the electromagnetic field, it is inherently advantageous to form the active region 40 as shown in FIG. 2. The organic spacer layers 110 do not undergo stimulated or spontaneous emission and largely do not absorb either the laser emission 70 or the pump beam 60 wavelengths. An example of an organic spacer layer 110 is the organic material 1,1-Bis-(4-bis(4-methyl-phenyl)-amino-phenyl)-cyclohexane (TAPC). TAPC works well as the spacer material since it largely does not absorb either the laser emission 70 or the pump beam 60 energy and, in addition, its refractive index is slightly lower than that of most organic host materials. This refractive index difference is useful since it helps in maximizing the overlap between the electromagnetic field antinodes 112 and the periodic gain region(s) 100. As will be discussed below with reference to the present invention, employing periodic gain region(s) 100 instead of a bulk gain region results in higher power conversion efficiencies and a significant reduction of the unwanted spontaneous emission. The placement of the periodic gain region(s) 100 is determined by using the standard matrix method of optics (Scott W. Corzine et al., IEEE Journal of Quantum Electronics, Vol. 25, No. 6, June 1989, pages 1513–1524). To get good results, the thicknesses of the periodic gain region(s) 100 need to be at or below 50 nm in order to avoid unwanted spontaneous emission. The laser can be increased in area while maintaining a degree of spatial coherence by utilizing the phase-locked organic laser array 190 as depicted in FIG. 3. In order to form a two-dimensional phase-locked laser array 190, lasing pixels 200 separated by inter-pixel regions 210 need to be defined on the surface of the VCSEL. To obtain phase locking, intensity and phase information must be exchanged amongst the lasing pixels 200. This is best obtained by weakly confining the laser emissions to the pixel regions by either small amounts of built-in index or gain guiding, e.g. by modulating the reflectance of one of the mirrors. In one embodiment, the reflectance modulation was affected by patterning and forming an etched region 220 in the bottom dielectric stack 30, using standard photolithographic and etching techniques, thus forming a two-dimensional array of circular pillars 221 on the surface of the bottom dielectric stack 30. The remainder of the organic laser microcavity structure is deposited upon the patterned bottom dielectric stack 30 as described above. In one embodiment, the shape of the laser pixels is circular; however, other pixel shapes are possible, such as rectangular, for example. The inter-pixel regions 210 is in the range of 0.25 to 4 $\mu$m. Phase-locked array operation also occurs for larger inter-pixel regions 210; however, it leads to inefficient usage of the optical-pumping energy. The etch depth is preferred to be from 200 to 1000 nm deep to form etched region 220. By etching just beyond an odd number of layers into the bottom dielectric stack 30, it is possible to affect a significant shift of the longitudinal mode wavelength in the etched region away from the peak of the gain media. Hence, lasing action is prevented and spontaneous emission is significantly reduced in the inter-pixel regions 210. The end result of the formation of etched region 220 is that the laser emission is weakly confined to the lasing pixels 200, no lasing originates from the inter-pixel regions 210, and coherent phase-locked laser light is emitted by the array 190.

One other advantage of the organic VCSEL devices, also herein referred to as organic laser cavity devices and used interchangeably, is that they can be easily fabricated into arrays of individually-addressable elements. In such arrays, each element would be incoherent with neighboring elements and pumped by a separate pump source (e.g. LED or group of LEDs). The arrays could either be one-dimensional (linear) or two-dimensional (area) depending on the requirements of the application. The elements in the array can also comprise multiple host-donor combinations and/or multiple cavity designs such that a number of wavelengths could be produced by a single array.

Figure 4:
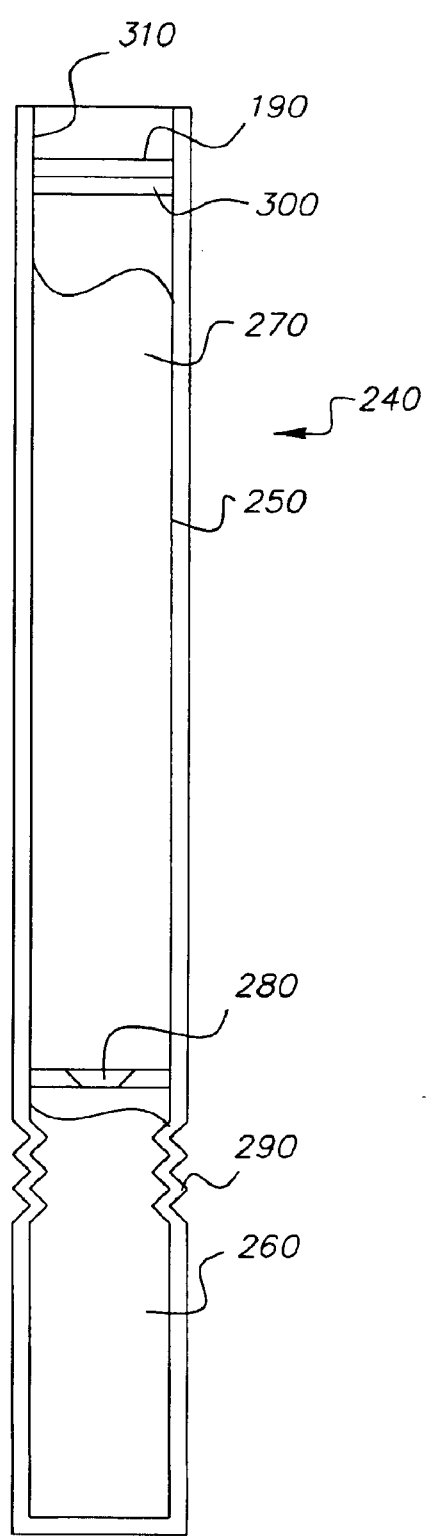
FIG. 4 is a schematic cross-section view of a chemically powered laser flare in an inactivated state made in accordance with the present invention.

Referring to FIG. 4, a cross-section illustration of an inactivated chemically illuminated laser flare 240 is shown. The inactivated chemically illuminated laser flare 240 could be deployed for use to target weapons systems, or as a signaling, search and rescue, or communications device. Due to the chemically produced light and lack of electronic components and processes the inactivated chemically illuminated laser flare 240 has no electromagnetic signature either in the non-deployed or deployed state. In addition, since the inactivated chemically illuminated laser flare 240 can be made almost exclusively from non-metallic materials, it would be extremely difficult to detect with convention metal detection means. The chemical reaction is triggered by combining two liquid chemical constituents that are normally sealed from each other by membrane 280. The liquids are held in a chambered container that serves as a flare housing 250. Flare housing 250 may be transparent or opaque depending on required application and may be a mirrored interior surface to increase the amount of available light. Activator solution 260 is $H_2O_2$, dissolved in a phthalic ester and chemiluminescent solution 270 is phenyl oxalate ester and a fluorescent dye. A force may be applied to flexible bellows manually, as a result of falling from several feet, e.g., as with being dropped from an airplane, or propelled at a surface, e.g., such as with a pneumatic or explosive type weapon. The bellows 290 are shown in their collapsed state in FIG. 5 as collapsed bellows 330. The collapsed bellows 330 increases the pressure on activator solution 260, resulting in ruptured membrane 320. The activator solution 260 mixes with the chemiluminescent solution 270 and begins to emit light. The chemically generated light passes through a diffusing filter 300 which can be transparent material such as polyurethane, plastic, or glass. The diffusing filter 300 may also incorporate a sintered fiber optic bundle, dichroic mirror, or a color filter. In general, the diffusing filter 300 removes unwanted wavelengths of light from the photon source light beam, and can provide uniform illumination of the organic cavity. Diffusing filter 300 is in close proximity with the phase-locked organic array 190. It may be held in position with proximity spacers or optical adhesives, not shown. Optional shroud 310 may be included to restrict the viewing angle of laser emission 70. Those skilled in the art would realize that the phase-locked organic array 190 could be replaced by the vertical cavity organic laser device 10 or 80 as depicted in FIGS. 1 and 2. Additionally, it may be advantageous to employ a multi-wavelength array of organic laser cavity devices. The use of such an array would enable more than one wavelength of light to be produced as a result of chemiluminescent, bioluminescent, and radioluminescent processes.

Figure 5:
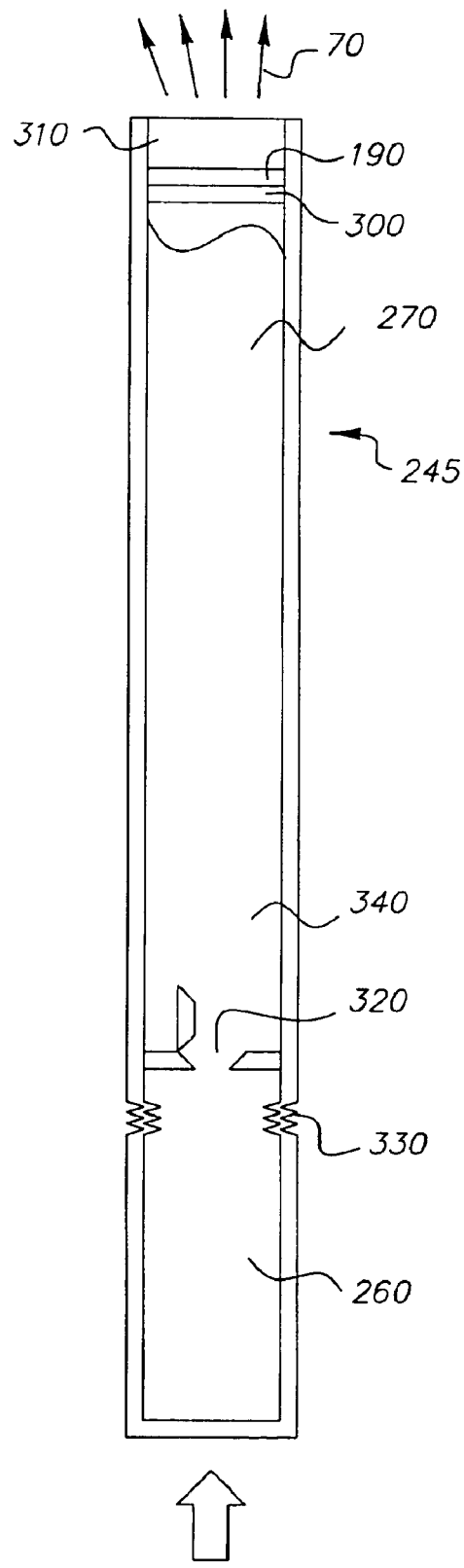
FIG. 5 is a schematic cross-section view of a chemically powered laser flare in an activated state made in accordance with the present invention.

FIG. 5 illustrates an activated chemically illuminated laser 245. Force has been applied to collapsed bellows 330. The combined activator 260 and chemiluminescent solution 270 forming activated chemiluminescent solution 340. Photons produced from this reaction pass through diffusing filter 300 and through phase-locked organic array 190 forming laser emission 70.

Figure 6:
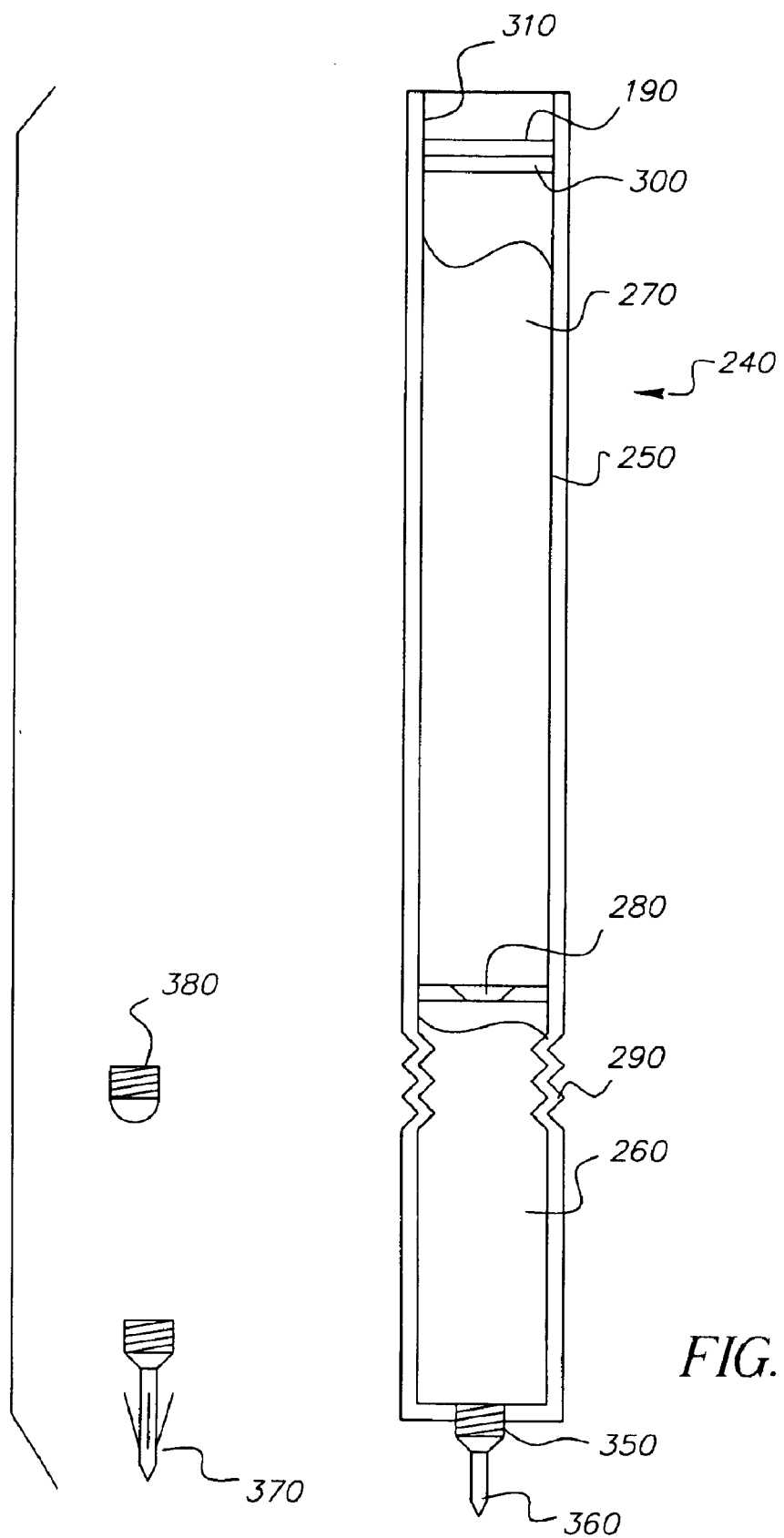
FIG. 6 is a schematic cross-section view of a chemically powered laser flare in an inactivated state with interchangeable mounting tips made in accordance with the present invention.

FIG. 6 illustrates a non-deployed laser flare 240 with interchangeable tip assembly 350 having optional tips that include a piercing tip 360, barbed tip 370, and a bludgeon tip 380. Due to the narrow view angle of the laser emission 70 the laser flare 240 could be held in a fixed position when activated. The optional tips provide different mounting options depending on conditions. For example, the piercing tip 360 may be used if the laser flare 240 is to be manually activated and attached to hard structures, like the roof of a building or a tree; or the bludgeon tip 380 may be used if the laser flare 240 is dropped from a height onto a natural surface such as earth or sand to deploy on impact.

Figure 7:
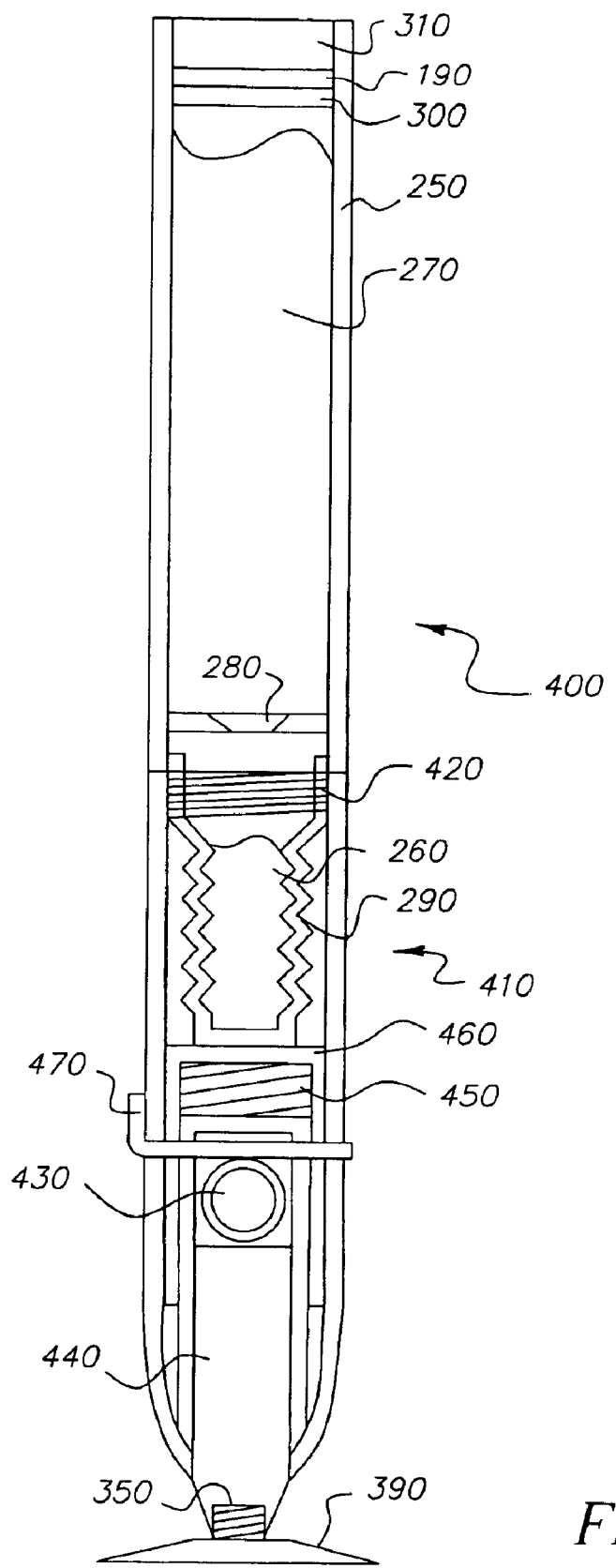
FIG. 7 is a schematic cross-section view of a modularly configured chemically powered laser flare in an activated state with a non-deployed time delay actuator made in accordance with the present invention.

FIG. 7 illustrates a modular laser flare 400 with modular attachment means 420, which can be, but are not limited to, a screw type thread attached to time delay actuator module 410. The components of module 410 include a capsule filled with liquid acetone, with is used to react with and erode styrene actuator bar 470 over time. The time for this reaction can be predetermined by the concentration of acetone used and can range from hours to days. Also included is interchangeable tip assembly 350 with suction cup/stand tip 390, a sealed acetone capsule 430, an acetone capsule striker 440, actuator spring 450, and actuator tube 460.

Figure 8:
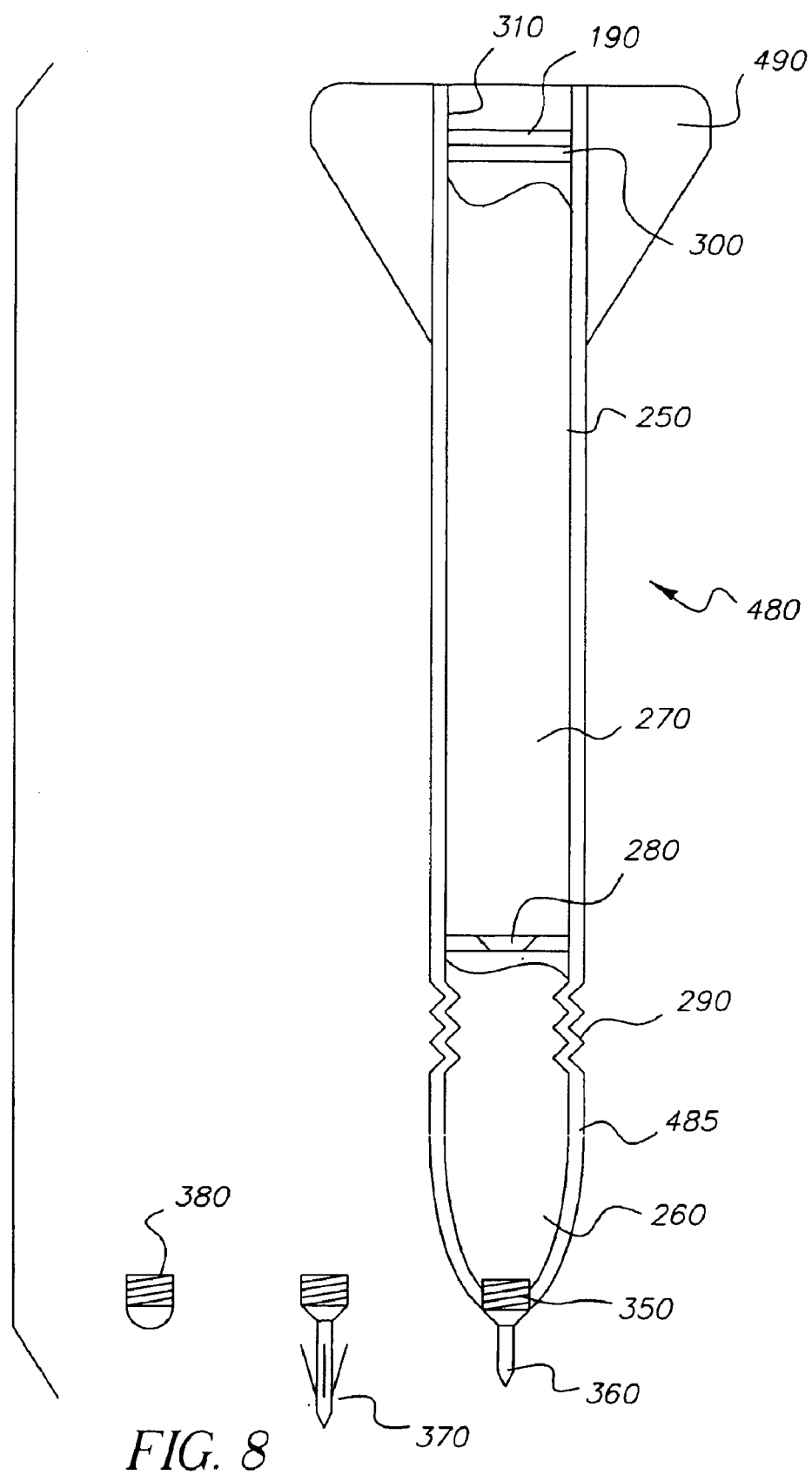
FIG. 8 is a schematic cross-section view of a dart-configured chemically powered laser flare in an inactivated state with interchangeable mounting tips made in accordance with the present invention.
Figure 9:
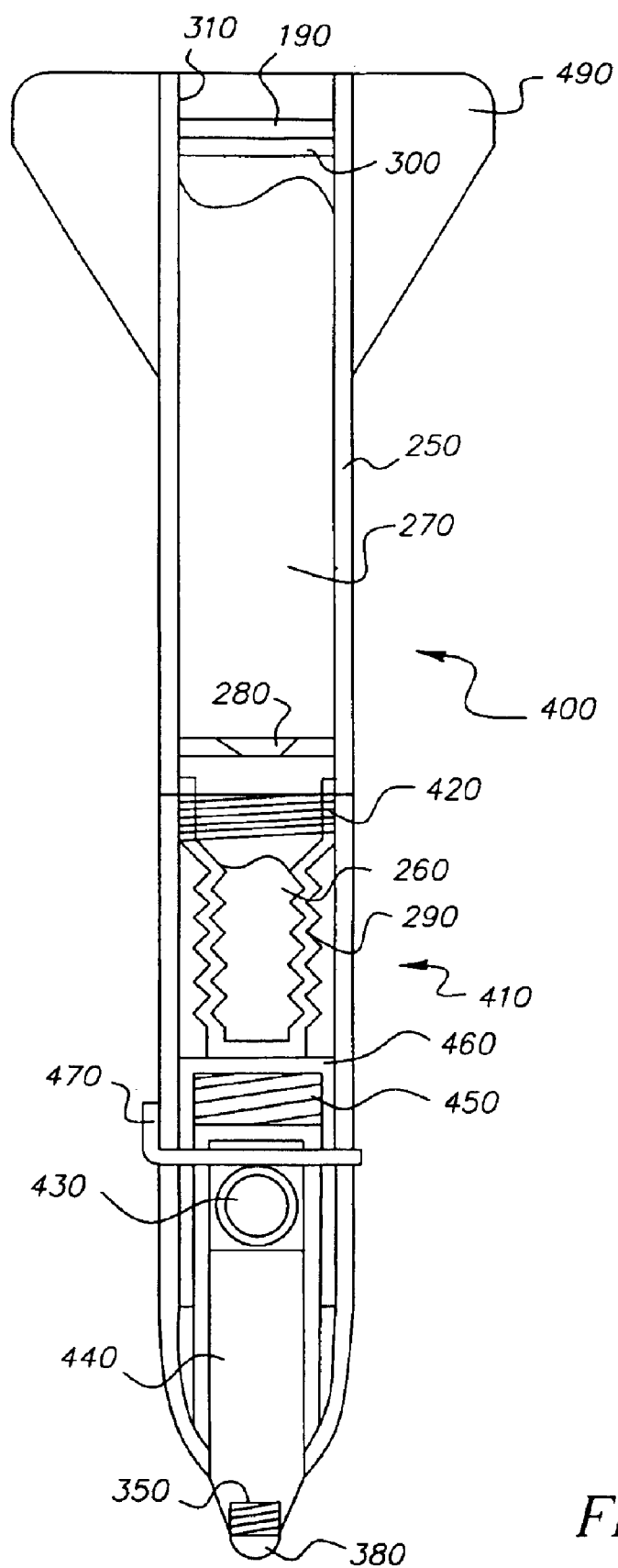
FIG. 9 is a schematic cross-section view of a modularly and dart-configured chemically powered laser flare with a time delay actuator in an inactivated state made in accordance with the present invention.
Figure 10C:
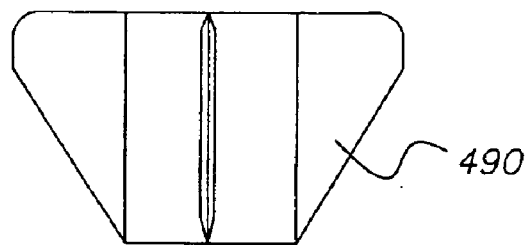
FIG. 10c is a schematic cross-section view of a guidance fin assembly for a modularly and dart-configured chemically powered laser flare made in accordance with the present invention.
Figure 10B:
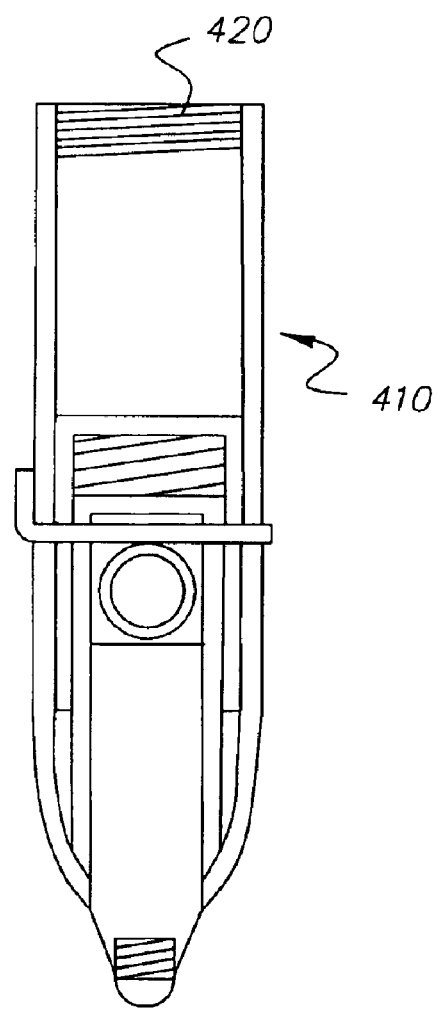
FIG. 10b is a cross-section view of a second section of a modularly and dart-configured chemically powered laser flare in an inactivated state made in accordance with the present invention.
Figure 10A:
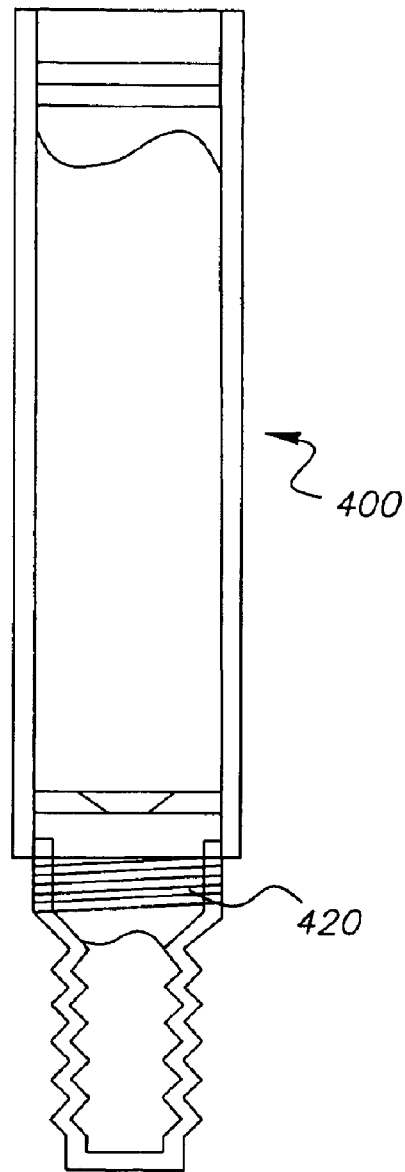
FIG. 10a is a schematic cross-section view of a first section of a modularly and dart-configured chemically powered laser flare in an inactivated state made in accordance with the present invention.

FIG. 8 illustrates a laser flare configured as an aerial dart 480 with tapered activator section 485 and attachable guidance fin assembly 490 used to ensure that the tapered activator section 485 makes contact with an intended target or surface. Similarly, FIG. 9 illustrates a modular laser flare 400 with time delay actuator module 410 and guidance fin assemble 490. FIGS. 10a, 10b, and 10c illustrate the same modular components including a first and second section (FIGS. 10a and 10b, respectively), and a guidance fin assembly (FIG. 10c), disassembled. The chemical reaction can be triggered by the initial impact or could be time delayed by use of a chemical or mechanical timer.

Figure 11:
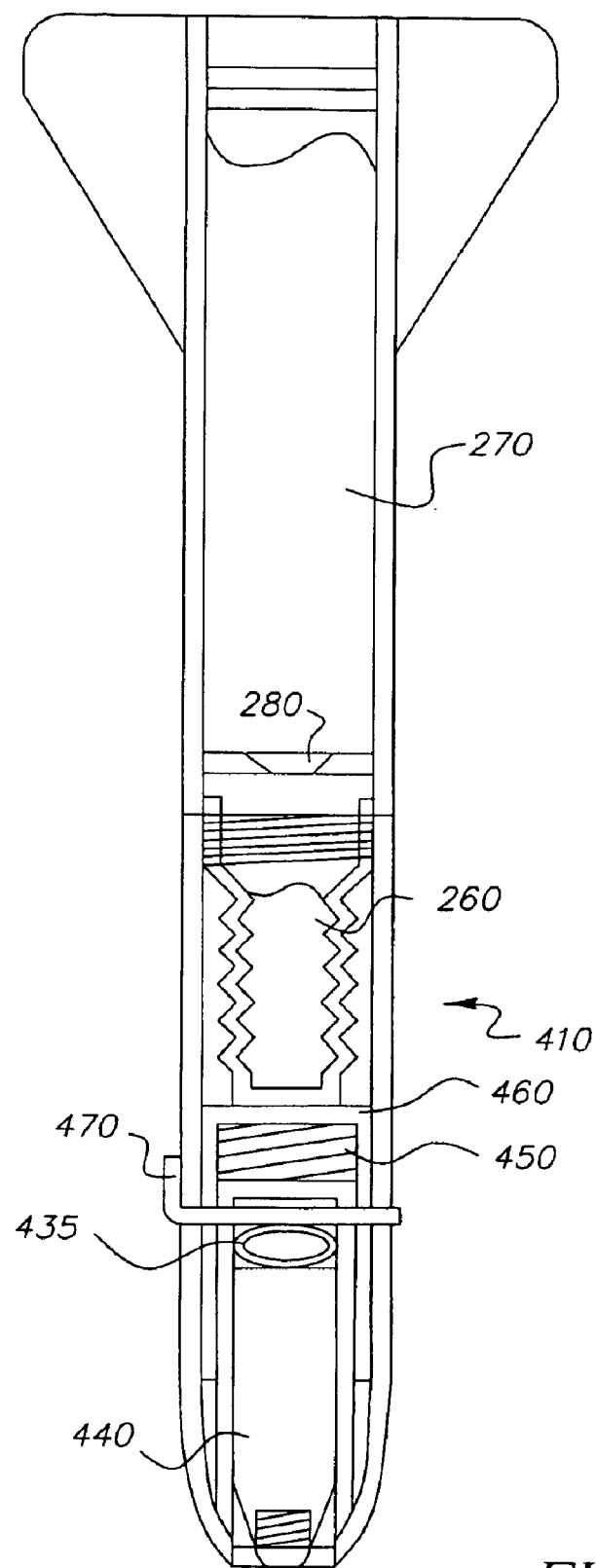
FIG. 11 is a schematic cross-section view of a modularly and dart-configured chemically powered laser flare in an inactivated state with a deployed time delay actuator made in accordance with the present invention.

FIG. 11 illustrates time delay actuator module 410 which has absorbed the activation force created manually or from impact by the movement of acetone capsule striker 440 which ruptures sealed acetone capsule 430 (also shown clearly in FIGS. 7 and 9) releasing liquid acetone and collapsing the capsule 435. The acetone begins to react with intact styrene actuator 470. Styrene actuator 470 maintains the position of actuator tube 460 and collapsed actuator spring 450. Styrene actuator 470 begins to erode over time.

Figure 12:
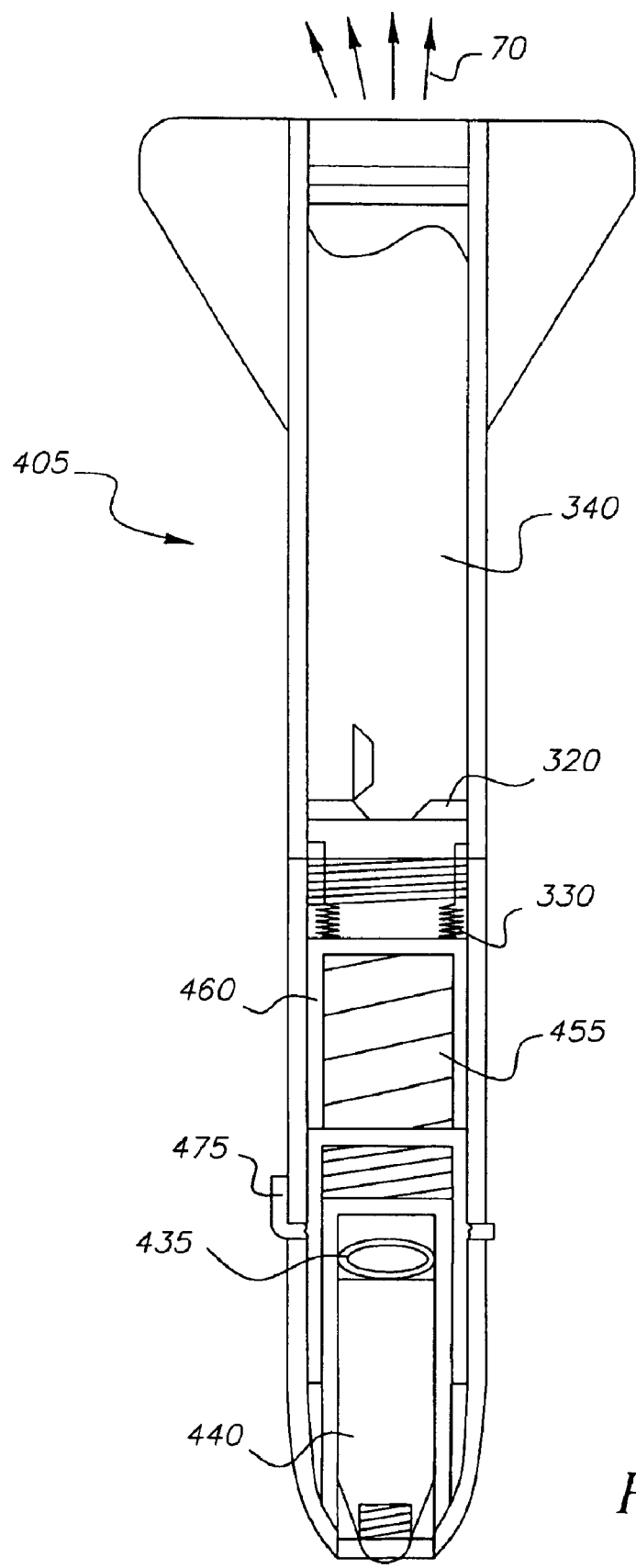
FIG. 12 is a schematic cross-section view of a modularly and dart-configured chemically powered laser flare in an activated state with a deployed and actuated time delay actuator made in accordance with the present invention.

FIG. 12 illustrates an activated modular laser flare 405. Styrene actuator bar has been eroded 475 releasing the pressure of expanded spring 455, moving actuator tube 460 collapsing activator bellows 330, which ruptures membrane valve 320. Activator solution 260 is mixed with chemiluminescent solution 270 (shown in FIG. 11) forming activated chemiluminescent solution 340 causing laser emission 70. Optionally styrene actuator bar 470 may be manually removed to instantly activate the device.

FIGS. 13a through 13f illustrates various physical configurations of the phase-locked organic laser array 190 each with different viewing angle characteristics. FIG. 13a is the standard configuration laser flare with view angle restricting shroud 310. FIG. 13b illustrates a laser flare with tapered activation section 485 and guidance fin assembly 490. FIG. 13c illustrates surface mounted phase-locked organic laser array 500. FIG. 13d illustrates hemispheric shaped laser array 510. FIG. 13e illustrates polyhedron shaped laser array 520. FIG. 13f illustrates a cylinder-shaped laser array 530.

Figure 14A:
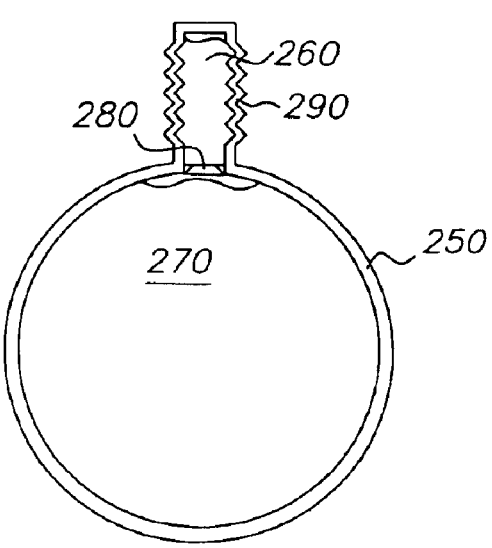
FIG. 14a is a schematic cross-sectional front view of a disk-shaped chemically powered light source, in an inactivated state, for use in conjunction with a laser array made in accordance with the present invention.

FIG. 14a illustrates a disk-shaped chemical illuminator with housing 250, activator solution 260, bellows 290, membrane valve 280, and chemiluminescent solution 270. This alternative shape is intended to illustrate that multiple sizes and shapes of this device is possible depending on the intended application.

Figure 14B:
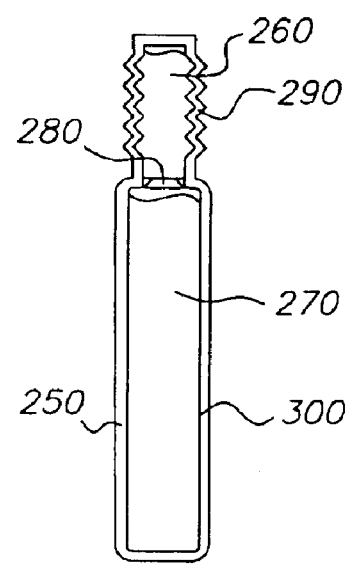
FIG. 14b is a schematic cross-sectional side view of a disk-shaped chemically powered light source, in an inactivated state, for use in conjunction with a laser array made in accordance with the present invention.

FIG. 14b illustrates a side view of a disk-shaped chemical illuminator with integrated diffuser/filter 300.

Figure 15A:
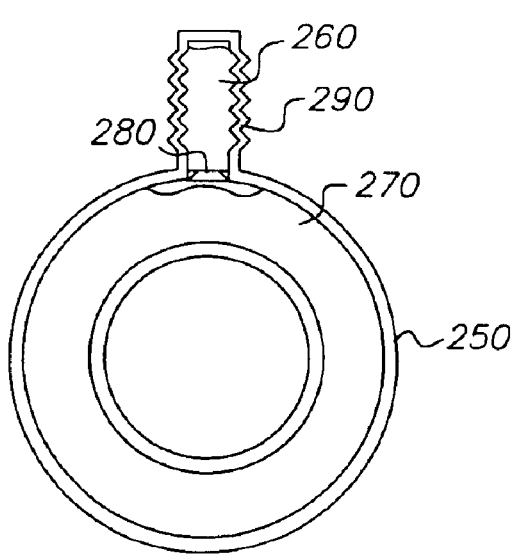
FIG. 15a is a schematic cross-sectional front view of a ring-shaped chemically powered light source, in an inactivated state, for use in conjunction with a laser array made in accordance with the present invention.

FIG. 15a illustrates a ring-shaped chemical illuminator with housing 250, activator solution 260, bellows 290, membrane valve 280, and chemiluminescent solution 270. This alternative shape is intended to illustrate that multiple sizes and shapes of this device is possible depending on the intended application.

Figure 15B:
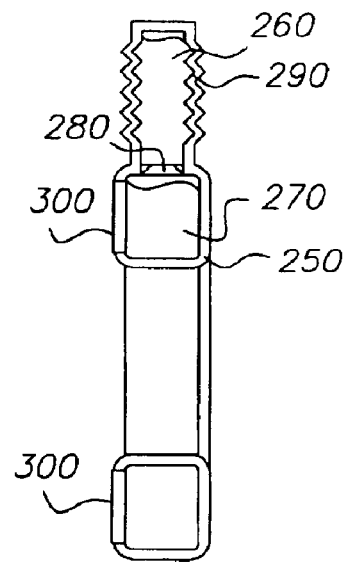
FIG. 15b is a schematic cross-sectional side view of a ring-shaped chemically powered light source, in an inactivated state, for use in conjunction with a laser array made in accordance with the present invention.

FIG. 15b illustrates a side view of a ring-shaped chemical illuminator with integrated diffuser/filter 300.

Figures 16A, 16B:
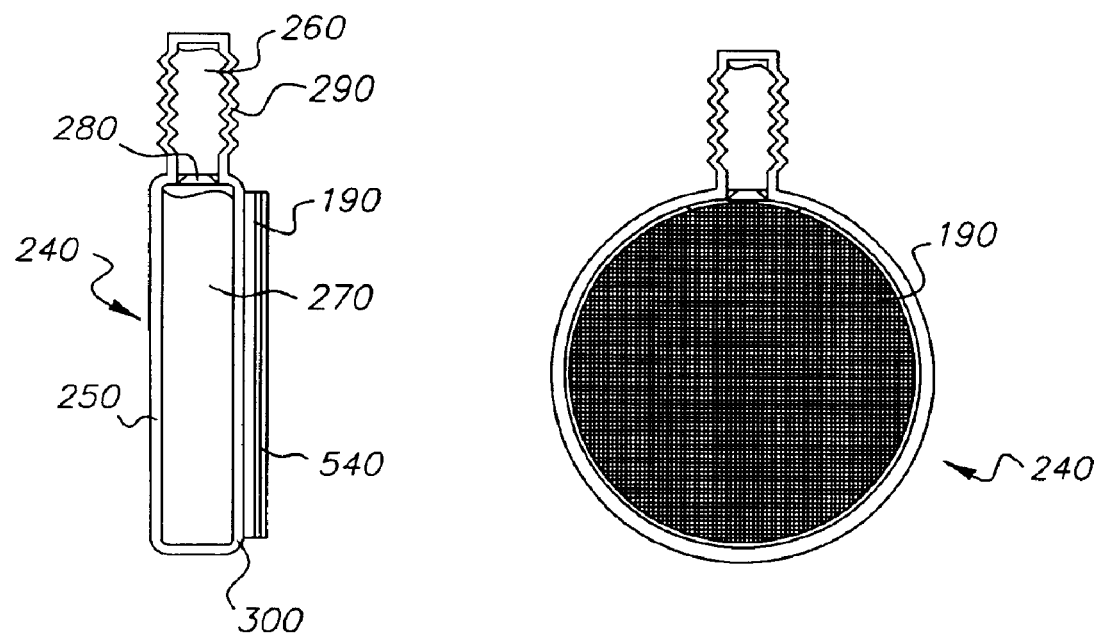
FIG. 16a is a schematic cross-sectional side view of a disk-shaped chemically powered light source, in an inactivated state, attached to a laser array which is partially obscured by a mask made in accordance with the present invention.
FIG. 16b is a schematic cross-sectional front view of a disk-shaped chemically powered light source, in an inactivated state, attached to a laser array made in accordance with the present invention.

FIG. 16a illustrates a side cross-sectional view of a disk-shaped laser flare 240 phase-locked organic laser array 190 and signal template 540. Signal template 540 is used to selectively mask the laser emission 70, not shown.

FIG. 16b illustrates an unmasked laser flare, which generates a large area laser emission.

Figure 16C:
FIG. 16c is a schematic cross-sectional front view of a disk-shaped chemically powered light source, in an inactivated state, attached to a laser array which is partially obscured by a mask made in accordance with the present invention.

FIG. 16c illustrates how a signal template 540 is used to create visible patterns such as alphanumeric characters, shapes, pointers etc.

Figure 17A:
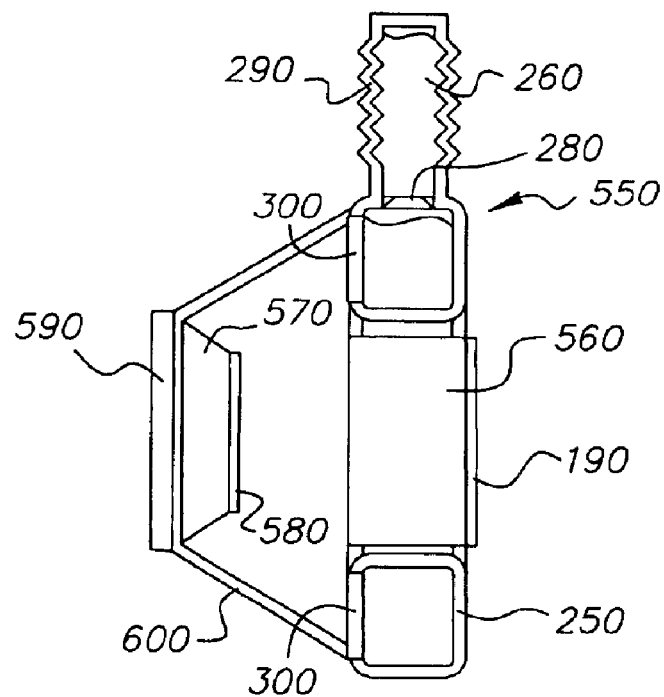
FIG. 17a is a schematic cross-sectional side view of a ring-shaped chemically powered light source, in an inactivated state, attached to a laser array incorporating a baffle and cone/mirror assembly which can vibrate by sound made in accordance with the present invention.

FIG. 17a illustrates a cross-sectional side view of audio modulated laser flare 550, including an opaque housing 600. Chemically generated light passes through diffuser filter 300, reflects off of mirror 580, through light baffle 560 and onto phase-locked organic laser array 190. Mirror 580 is attached to flexible cone 570. When a user, not shown, speaks through protective grid 590, vibrations cause flexible cone 570 and mirror 580 to vibrate. Flexible cone 570 is made of a thin membrane of a flexible material such as rubber or polyurethane. The vibrating mirror 580 changes the intensity of light that reaches phase-locked organic laser array 190, therein modulating the laser emission generated.

Figure 17B:
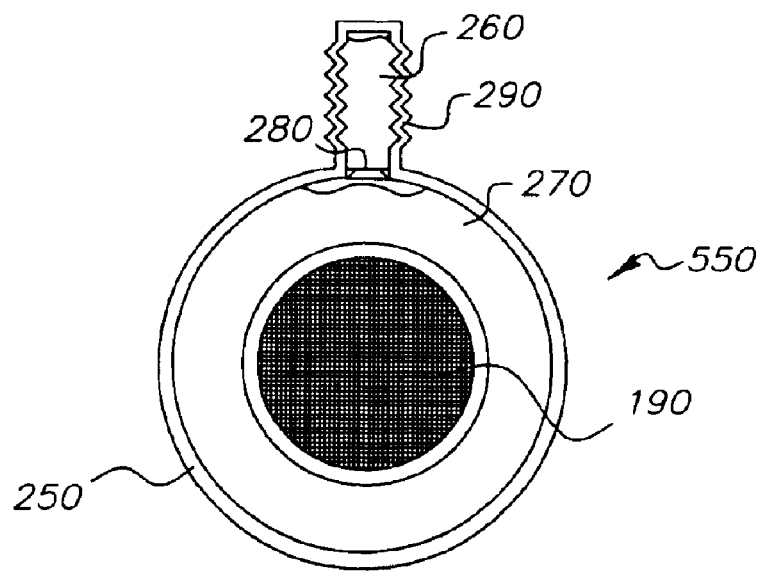
FIG. 17b is a schematic cross-sectional side view of a ring-shaped chemically powered light source, in an inactivated state, attached to a laser array incorporating a baffle and cone/mirror assembly which can vibrate by sound to modulate the laser emission made in accordance with the present invention.

FIG. 17b illustrates a cross-sectional front view of audio modulated laser flare 550 illustrating a ring-shaped chemical light source and large area phase-locked organic laser array 190.

Figure 18A:
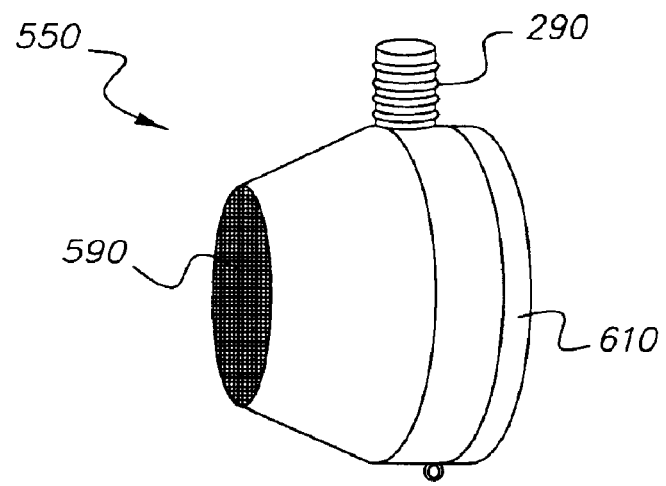
FIG. 18a is a perspective view of a chemically illuminated laser signaling device, in a closed, inactivated state made in accordance with the present invention.

FIG. 18a is a perspective view of a non-deployed audio modulated laser flare 550 with closed protective cover 610 and extended bellows 290.

Figure 18B:
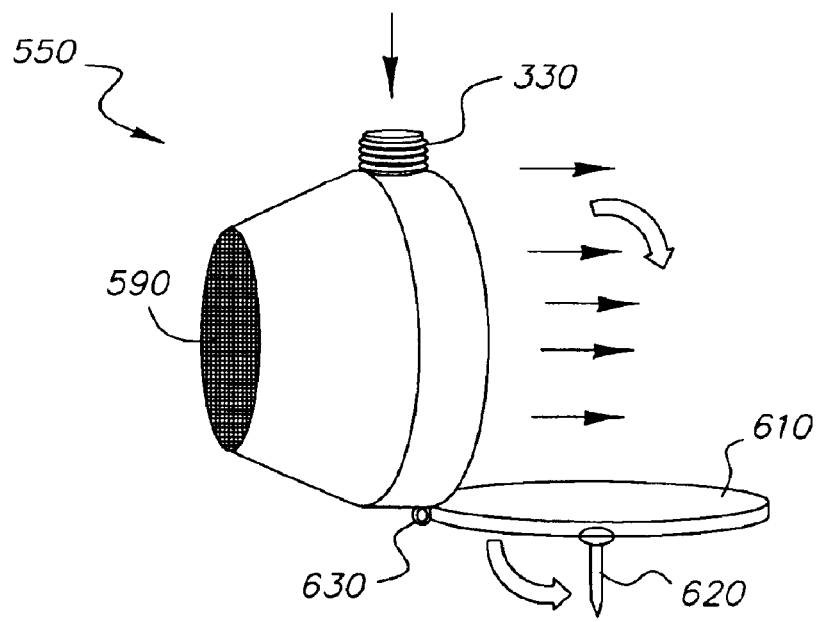
FIG. 18b is a perspective view of a chemically illuminated laser signaling device, in an opened, activated state made in accordance with the present invention.

FIG. 18b is a perspective view of an activated audio modulated laser flare 550 with opened protective cover 610 and collapsed bellows 330. Mounting spike 620 is used to secure the audio modulated laser flare 550 to a stable structure and hinge 630 is also used to maintain position.

Figure 19:
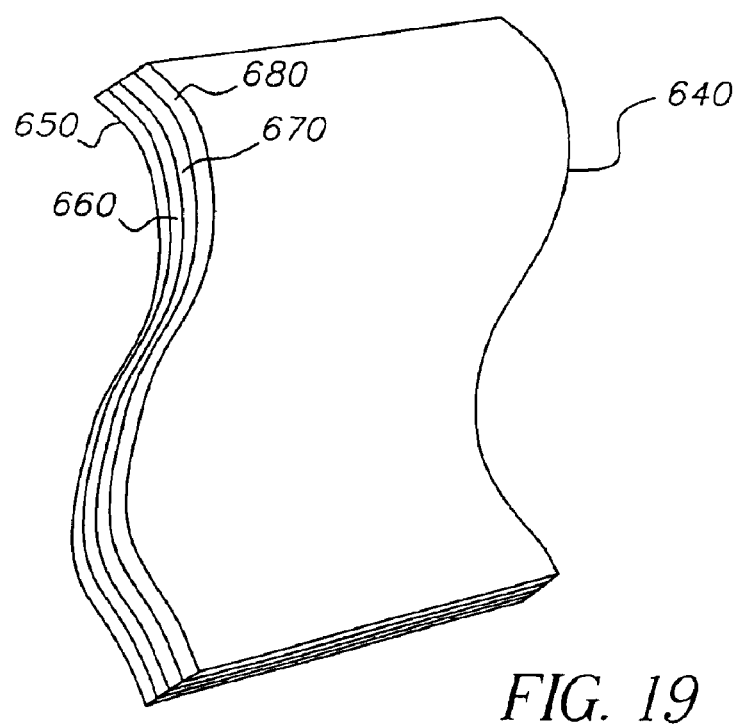
FIG. 19 is a perspective view of a chemically illuminated flexible sheet laser emitter in accordance with the present invention.

FIG. 19 is a perspective view of a flexible chemically illuminated laser sheet 640 composed of multiple layers including flexible activator pouch 650, flexible chemiluminescent pouch 660, flexible diffuser 670, and flexible substrate phase-locked organic laser array 680.

FIG. 20a illustrates a cross-sectional side view of a flexible chemically illuminated laser sheet 640 with sealed membrane valve 280. This prevents activator solution 260 from contacting chemiluminescent solution 270 until sealed membrane valve 280 is opened.

FIG. 20b illustrates a cross-sectional side view of a flexible chemically illuminated laser sheet 640. When pressure is applied to the assembly, sealed valve 280 is opened 320 allowing activator solution 260 to mix with chemiluminescent solution 270 forming the light generated activated chemiluminescent solution 340 which passes though flexible diffuser filter 670 causing flexible substrate phase-locked organic laser array 680 to produce laser emission 70.

Figure 21:
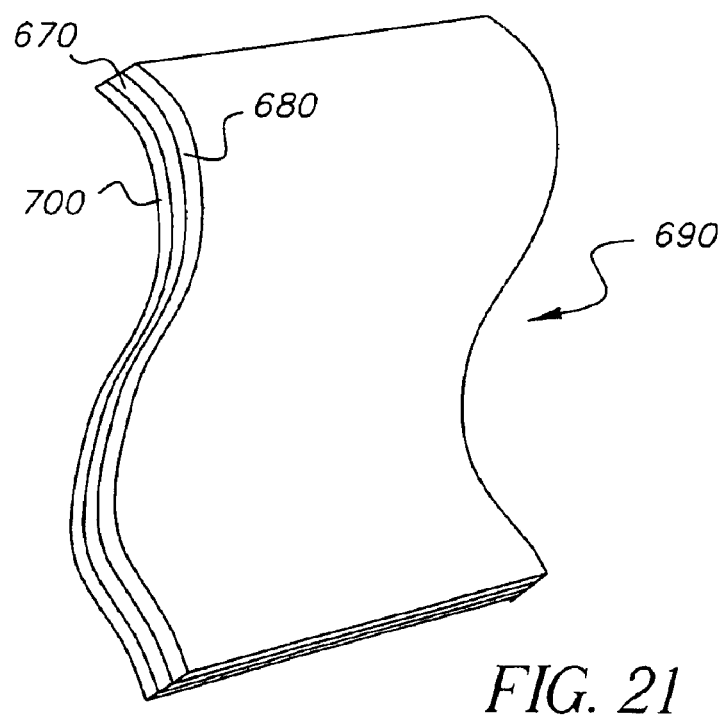
FIG. 21 is a perspective view of a radio illuminated flexible sheet laser emitter in accordance with the present invention.

FIG. 21 is a perspective view of a flexible radio illuminated laser sheet 690 composed of multiple layers including a flexible radio illuminator such as radium paint or a radium emulsion 700, flexible diffuser 670, and flexible substrate phase-locked organic laser array 680.

FIG. 22 is a cross-sectional side view of a flexible radio illuminated laser sheet 690 composed of multiple layers including a flexible radio-illuminator such as radium paint or a radium emulsion 700, flexible diffuser 670, and flexible substrate phase-locked organic laser array 680. The constant source of photons from the flexible radio illuminator 700, passes through the flexible diffuser 670, causing the flexible substrate phase-locked organic laser array 680 to produce laser emission 70. This device will provide a continuous laser emission as long as the radio illuminator 700 emits photons. This reaction and laser emission will last for years.

Figure 23:
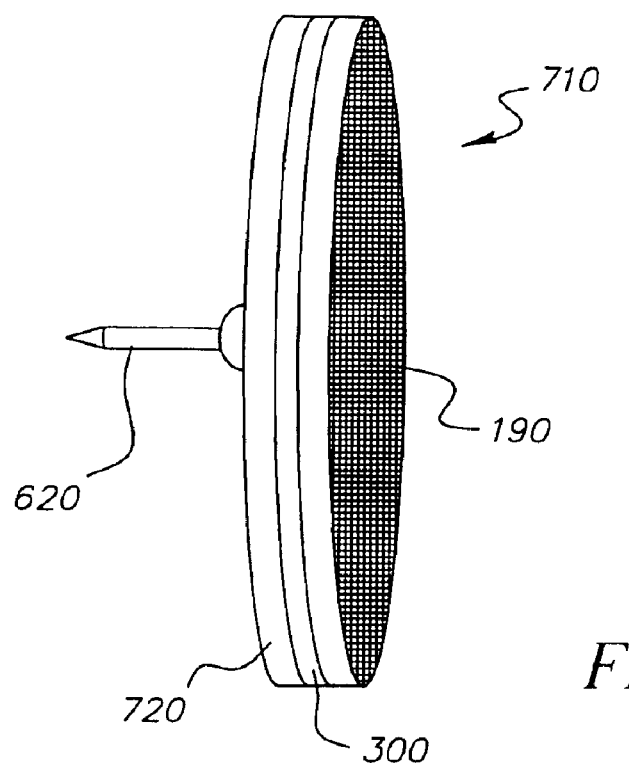
FIG. 23 is a perspective view of a radio illuminated laser emitter in accordance with the present invention.

FIG. 23 is a perspective view of a radio illuminated laser emitter 710 with radio illuminator 720, diffuser filter 300, and phase-locked laser array 190. Mounting spike 620 is used to attach the laser emitter 710 to an object, such as a vehicle or a fixed location. Other mounting options, previously mentioned, may also be used.

Figure 24:
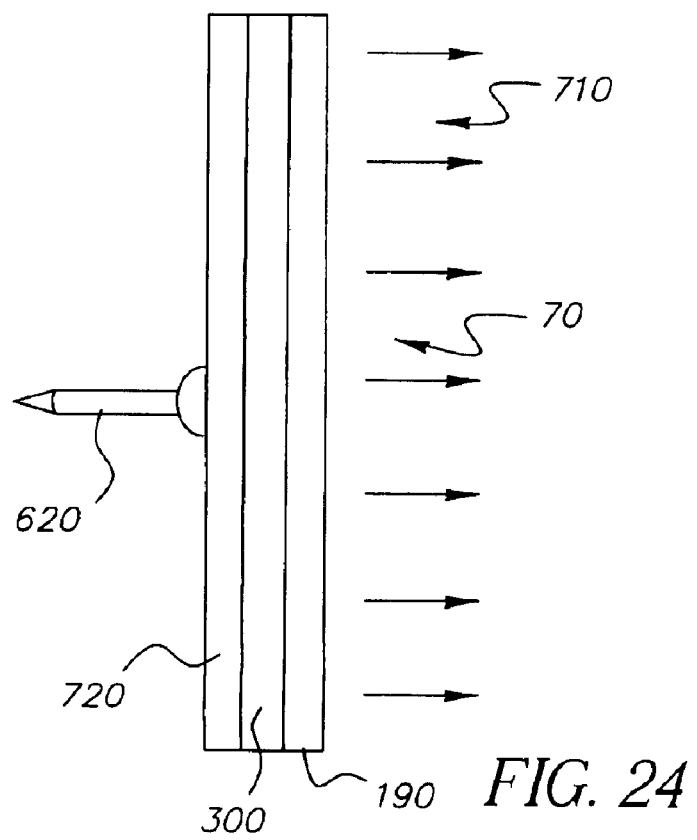
FIG. 24 is schematic cross-sectional side view of a radio illuminated laser emitter in accordance with the present invention.

FIG. 24 is schematic cross-sectional side view of a radio illuminated laser emitter 710. Photons generated from radio illuminator 720 pass through diffuser filter 300, causing phase-locked laser array 190 to produce laser emission 70.

Figure 25:
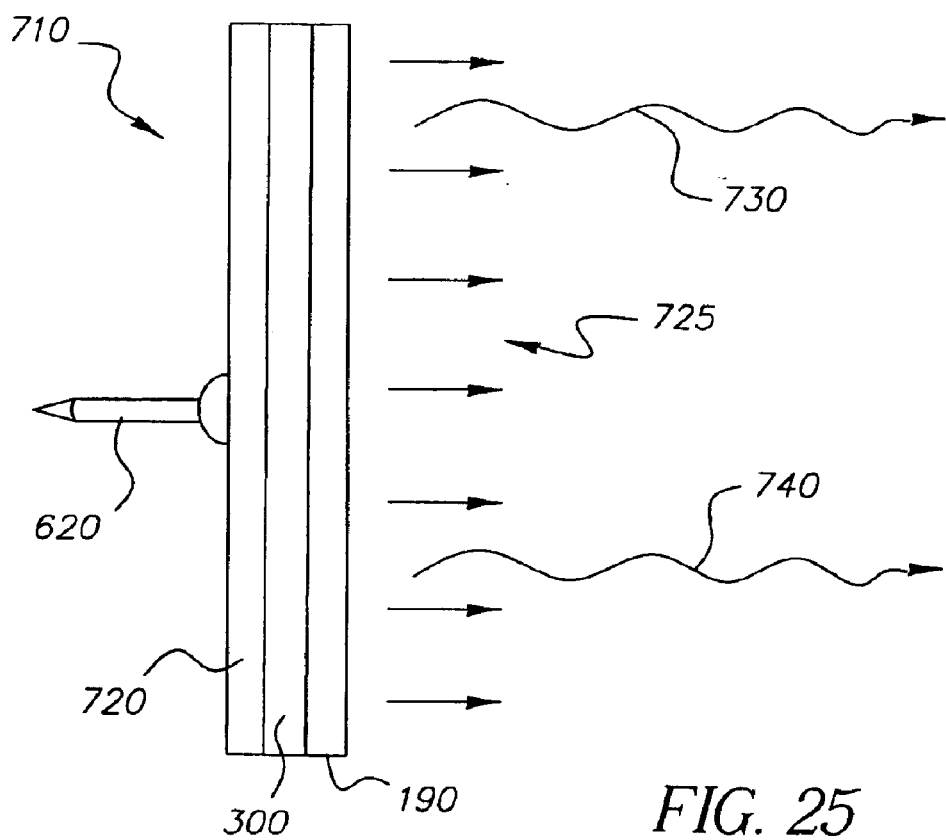
FIG. 25 is schematic cross-sectional side view of a radio illuminated multi-wavelength laser emitter.

FIG. 25 is schematic cross-sectional side view of a radio illuminated laser emitter 710. Photons generated from radio illuminator 720 pass through diffuser filter 300, causing multi-wavelength laser array 725 to produce laser output emissions, 730 and 740.

The invention has been described with reference to a preferred embodiment; However, it will be appreciated that variations and modifications can be effected by a person of ordinary skill in the art without departing from the scope of the invention.

PARTS LIST 10 vertical cavity organic laser device
20 substrate
30 bottom dielectric stack
40 organic active region
50 top dielectric stack
60 pump beam
65 pump beam source
70 laser emission
80 vertical cavity organic laser device
100 periodic gain regions
103 antinodes
105 electromagnetic field nodes
110 organic spacer layers
120 electromagnetic field pattern
190 phase-locked organic laser array
200 lasing pixels
210 inter-pixel regions
220 etched regions
221 circular pillars
240 chemically illuminated laser flare (non-deployed)
245 chemically illuminated laser flare (activated)
250 flare housing (opaque, transparent, or internally reflective)
260 activator solution (H2O2, dissolved in a phthalic ester)
270 chemiluminescent solution (phenyl oxalate ester and fluorescent dye)
280 membrane valve (sealed)
290 bellows (extended)
300 diffusing filter (transparent polyurethane, sintered fiber optic bundle, filter, etc,)
310 shroud (optional, to restrict viewing angle)
320 membrane valve (opened)
330 bellows (collapsed)
340 activated chemiluminescent solution
350 interchangeable tip assembly
360 piercing tip
370 barbed tip
380 bludgeon tip
390 suction cup/stand tip
400 laser flare modular configuration (non-deployed)
405 activated laser flare modular configuration
410 time delay actuator module
420 modular attachment means
430 acetone capsule (sealed)
435 acetone capsule (opened)
440 acetone capsule striker
450 actuator spring (collapsed)
455 actuator spring (expanded)
460 actuator tube
470 styrene actuator bar (intact)
475 styrene actuator bar (eroded)
480 laser flare dart configuration
485 tapered activator section 490 guidance fin assembly
500 surface mounted laser array
510 hemispheric shaped laser array
520 polyhedron shaped laser array
530 cylinder-shaped laser array
540 attachable signal template
550 audio modulated laser flare
560 light baffle
570 flexible cone
580 mirror
590 protective grid
600 opaque housing
610 cover/mount
620 mounting spike
630 hinge
640 flexible chemically illuminated laser sheet
650 flexible activator pouch
660 flexible chemiluminescent pouch
670 flexible diffuser
680 flexible substrate laser array
690 flexible radio illuminated laser sheet
700 flexible radioluminescent sheet (radium emulsion or paint)
710 radio illuminated laser emitter
720 radio illuminator
725 multi-wavelength laser
730 laser output emission
740 laser output emission

What is claimed is:

1. An organic laser cavity device, comprising:
  a) a first dielectric stack for receiving and transmitting pumped beam light and being reflective to laser light over a predetermined range of wavelengths and having a substantially low threshold for optical excitation, below 0.1 $W/cm^2$ power density;
  b) an organic active region, including one or more periodic gain regions and organic spacer layers disposed on either side of the periodic gain region and arranged so that the periodic gain regions are aligned with antinodes of the organic laser cavity device's standing wave electromagnetic field, and being in proximate contact with the first dielectric stack, for receiving the transmitted pumped beam light and the laser light from the first dielectric stack, and emitting the laser light;
  c) a second dielectric stack, in proximate contact with the organic active region and spaced from the first dielectric stack, for reflecting the transmitted pumped beam light and the laser light from the organic active region back into the organic active region, wherein a combination of the first and the second dielectric stacks and the organic active region outputs the laser light; and
  d) an external self-contained non-electrical photon source of the pumped beam light optimized for coupling with the organic laser cavity device for optical excitation at the substantially low threshold, wherein said optimization is based on providing uniform illumination.

2. The organic laser cavity device as claimed in claim 1, wherein the external self-contained photon source is activated by a chemiluminescent reaction.

3. The organic laser cavity device as claimed in claim 1, wherein the external self-contained photon source is activated by a radioluminescent reaction.

4. The organic laser cavity device as claimed in claim 1, wherein the external self-contained photon source is activated by a bioluminescent reaction.

5. The organic laser cavity device as claimed in claim 2, wherein the external self-contained photon source is activated by mixing a chemiluminescent solution with an activator solution.

6. The organic laser cavity device as claimed in claim 2, wherein the external self-contained photon source is a chemiluminescent flare.

7. The organic laser cavity device as claimed in claim 1, wherein the external self-contained photon source is activated by a phosphorescence reaction.

8. The organic laser cavity device as claimed in claim 1, wherein the self-contained photon source is activated by an oxidation reaction.

9. The organic laser cavity device as claimed in claim 1, wherein the self-contained photon source is energized by a radiological reaction.

10. The organic laser cavity device as claimed in claim 9, wherein the radiological reaction is produced by radium.

11. The organic laser cavity device as claimed in claim 1, further comprising:
  e) a diffusing filter for producing uniform illumination of the organic laser cavity device.

12. An organic laser cavity device, comprising:
  a) a first dielectric stack for receiving and transmitting pumped beam light and being reflective to laser light over a predetermined range of wavelengths and having a substantially low threshold for optical excitation, below 0.1 $W/cm^2$ power density;
  b) an organic active region, including one or more periodic gain regions and organic spacer layers disposed on either side of the periodic gain region and arranged so that the periodic gain regions are aligned with antinodes of the organic laser cavity device's standing wave electromagnetic field, and being in proximate contact with the first dielectric stack, for receiving the transmitted pumped beam light and the laser light from the first dielectric stack, and emitting laser light;
  c) a second dielectric stack, in proximate contact with the organic active region and spaced from the first dielectric stack, for reflecting the transmitted pumped beam light and the laser light from the organic active region back into the organic active region, wherein a combination of the first and the second dielectric stacks and the organic active region outputs the laser light;
  d) an external self-contained non-electrical photon source of the pumped beam light optimized for coupling with the organic laser cavity device for optical excitation at the substantially low threshold, wherein said optimization is based on providing uniform illumination; and
  e) means for modulating intensity of the pumped beam light.

13. The means for modulating intensity of the pumped beam light as claimed in claim 12 and being selected from the group consisting of: mechanical and acoustical.

14. A plurality of uniformly arranged organic laser cavity devices, comprising:
  a) a first dielectric stack for receiving and transmitting pumped beam light and being reflective to laser light over a predetermined range of wavelengths and having a substantially low threshold for optical excitation, below 0.1 $W/cm^2$ power density;
  b) an organic active region, including one or more periodic gain regions and organic spacer layers disposed on either side of the periodic gain region and arranged so that the periodic gain regions are aligned with antinodes of the organic laser cavity device's standing wave electromagnetic field, and being in proximate contact with the first dielectric stack, for receiving the transmitted pumped beam light and the laser light from the first dielectric stack, and emitting laser light;

c) a second dielectric stack, in proximate contact with the organic active region and spaced from the first dielectric stack, for reflecting the transmitted pumped beam light and the laser light from the organic active region back into the organic active region, wherein a combination of the first and the second dielectric stacks and the organic active region outputs the laser light; and d) an external self-contained non-electrical photon source of the pumped beam light optimized for coupling with each of the plurality of uniformly arranged organic laser cavity devices for optical excitation at the substantially low threshold, wherein said optimization is based on providing uniform illumination.

15. The organic laser cavity devices as claimed in claim 14, wherein the external self-contained photon source is activated by a chemiluminescent reaction.

16. The organic laser cavity devices as claimed in claim 14, wherein the external self-contained photon source is activated by a radioluminescent reaction.

17. The organic laser cavity devices as claimed in claim 14, wherein the external self-contained photon source is activated by a bioluminescent reaction.

18. The organic laser cavity devices as claimed in claim 15, wherein the external self-contained photon source is activated by mixing a chemiluminescent solution with an activator solution.

19. The organic laser cavity devices as claimed in claim 15, wherein the external self-contained photon source is a chemiluminescent flare.

20. The organic laser cavity devices as claimed in claim 14, wherein the external self-contained photon source is activated by a phosphorescence reaction.

21. The organic laser cavity devices as claimed in claim 14, wherein the self-contained photon source is activated by an oxidation reaction.

22. The organic laser cavity devices as claimed in claim 14, wherein the self-contained photon source is energized by a radiological reaction.

23. The organic laser cavity devices as claimed in claim 22, wherein the radiological reaction is produced by radium.

24. The organic laser cavity devices as claimed in claim 14, further comprising:

e) a diffusing filter for producing uniform illumination of the organic laser cavity.

25. A plurality of organic laser cavity devices, comprising:

a) a first dielectric stack for receiving and transmitting pumped beam light and being reflective to laser light over a predetermined range of wavelengths and having a substantially low threshold for optical excitation, below 0.1 W/cm² power density;

b) an organic active region, including one or more periodic gain regions and organic spacer layers disposed on either side of the periodic gain region and arranged so that the periodic gain regions are aligned with antinodes of the organic laser cavity device's standing wave electromagnetic field, and being in proximate contact with the first dielectric stack, for receiving the transmitted pumped beam light and the laser light from the first dielectric stack, and emitting laser light;

c) a second dielectric stack, in proximate contact with the organic active region and spaced from the first dielectric stack, for reflecting the transmitted pumped beam light and the laser light from the organic active region back into the organic active region, wherein a combination of the first and the second dielectric stacks and the organic active region outputs the laser light;

d) a single external self-contained non-electrical photon source of the pumped beam light optimized for coupling with the plurality of organic laser cavity devices for optical excitation at the substantially low threshold, wherein said optimization is based on providing uniform illumination; and e) means for modulating intensity of the pumped beam light.

26. The means for modulating intensity of the pumped beam light as claimed in claim 25 and being selected from the group consisting of: mechanical and acoustical.

27. A multi-wavelength array of organic laser cavity devices that produces one or more wavelengths of laser light, comprising:

a) a first dielectric stack for receiving and transmitting pumped beam light and being reflective to laser light over a predetermined range of wavelengths and having a substantially low threshold for optical excitation, below 0.1 W/cm² power density;

b) an organic active region, including one or more periodic gain regions and organic spacer layers disposed on either side of the periodic gain region and arranged so that the periodic gain regions are aligned with antinodes of the organic laser cavity device's standing wave electromagnetic field, and being in proximate contact with the first dielectric stack, for receiving the transmitted pumped beam light and the laser light from the first dielectric stack, and emitting laser light;

c) a second dielectric stack, in proximate contact with the organic active region and spaced from the first dielectric stack, for reflecting the transmitted pumped beam light and the laser light from the organic active region back into the organic active region, wherein a combination of the first and the second dielectric stacks and the organic active region outputs the one or more wavelengths of laser light; and d) an external self-contained non-electrical photon source of the pumped beam light optimized for coupling with each of the plurality of organic laser cavity devices for optical excitation at the substantially low threshold, wherein said optimization is based on uniform illumination.

28. A laser emission device having at least one organic laser cavity with an organic active region, and comprising:

(a) one or more periodic gain regions and organic spacer layers disposed on either side of the one or more periodic gain regions and arranged so that the one or more periodic gain regions are aligned with antinodes of the organic laser cavity device's standing wave electromagnetic field, and (b) a means for laser emission triggered by a mixing of a chemiluminescent solution and an activator solution.

29. The laser emission device claimed in claim 28, wherein the means for laser emission initiates a time delay for the mixing of the chemiluminescent solution and the activator solution.

* * * * *